United States Patent
Park

(10) Patent No.: US 10,978,656 B2
(45) Date of Patent: *Apr. 13, 2021

(54) ORGANIC LIGHT EMITTING DISPLAY DEVICE HAVING LAYER TO CONTROL CHARGE TRANSFER

(71) Applicant: LG DISPLAY CO., LTD., Seoul (KR)

(72) Inventor: EunJung Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/852,096

(22) Filed: Apr. 17, 2020

(65) Prior Publication Data

US 2020/0243787 A1  Jul. 30, 2020

Related U.S. Application Data

(63) Continuation of application No. 16/444,958, filed on Jun. 18, 2019, now Pat. No. 10,665,807, which is a
(Continued)

(30) Foreign Application Priority Data

Nov. 19, 2015 (KR) .................. 10-2015-0162862
May 31, 2016 (KR) .................. 10-2016-0067756

(51) Int. Cl.
*H01L 51/50* (2006.01)
*H01L 51/52* (2006.01)
(Continued)

(52) U.S. Cl.
CPC ...... *H01L 51/5012* (2013.01); *H01L 27/3209* (2013.01); *H01L 51/5004* (2013.01);
(Continued)

(58) Field of Classification Search
CPC ............ H01L 27/3209; H01L 51/5004; H01L 2251/552; H01L 2251/55
See application file for complete search history.

(56) References Cited

U.S. PATENT DOCUMENTS 9,831,454 B2 * 11/2017 Park .................. H01L 51/5072
10,243,158 B2 * 3/2019 Park .................. H01L 51/5092
(Continued)

FOREIGN PATENT DOCUMENTS

| DE | 102010004453 | * | 7/2011 | ............ H01L 51/52 |
| EP | 2889929 | * | 7/2015 | ............ H01L 51/50 |
| KR | 10-2011-0035048 A | | 4/2011 | |

OTHER PUBLICATIONS

H. Kim et al., Synthesis and Characterization of Quinoxaline Derivative as Organic Semiconductors for Organic Thin-Film Transistors, Aug. 1, 2017, J. Nanoscience & Nanotechnology, vol. 17, pp. 5530-5538. (Year: 2017).*

(Continued)

*Primary Examiner* — Victoria K. Hall
(74) *Attorney, Agent, or Firm* — Birch, Stewart, Kolasch & Birch, LLP

(57) ABSTRACT

An organic light emitting display device includes a plurality of pixels on a substrate, the plurality of pixels having a red subpixel, a green subpixel, and a blue subpixel; an anode on the substrate; a first hole transfer layer on the anode; a first emission layer on the first hole transfer layer in the red subpixel, the green subpixel, and the blue subpixel; a first electron transfer layer on the first emission layer; an N-type charge generation layer on the first electron transfer layer; a second hole transfer layer on the N-type charge generation layer; a second emission layer on the second hole transfer layer in the red subpixel, the green subpixel, and the blue subpixel; a second electron transfer layer on the second
(Continued)

emission layer; and a cathode on the second electron transfer layer,

31 Claims, 12 Drawing Sheets

Related U.S. Application Data continuation of application No. 15/244,871, filed on Aug. 23, 2016, now Pat. No. 10,374,183.

(51) Int. Cl.
    *H01L 27/32*     (2006.01)
    *H01L 51/00*     (2006.01)

(52) U.S. Cl.
    CPC ...... *H01L 51/5044* (2013.01); *H01L 51/5056* (2013.01); *H01L 51/5072* (2013.01); *H01L 51/5084* (2013.01); *H01L 51/5278* (2013.01); *H01L 51/0052* (2013.01); *H01L 51/0067* (2013.01); *H01L 51/0072* (2013.01); *H01L 51/0077* (2013.01); *H01L 51/0081* (2013.01); *H01L 2251/552* (2013.01)

(56) References Cited

U.S. PATENT DOCUMENTS

| | | | |
|---|---|---|---|
| 10,374,183 B2* | 8/2019 | Park | H01L 51/5084 |
| 10,411,194 B2 | 9/2019 | Kim et al. | |
| 10,665,807 B2* | 5/2020 | Park | H01L 51/5076 |
| 2003/0075720 A1 | 4/2003 | Liao et al. | |
| 2003/0170491 A1* | 9/2003 | Liao | H01L 51/5278 |
| | | | 428/690 |
| 2006/0093856 A1 | 5/2006 | Helber et al. | |
| 2006/0204784 A1 | 9/2006 | Begley et al. | |
| 2006/0204786 A1 | 9/2006 | Begley et al. | |
| 2006/0246315 A1 | 11/2006 | Begley et al. | |
| 2006/0289882 A1 | 12/2006 | Nishimura et al. | |
| 2007/0001588 A1* | 1/2007 | Boroson | H01L 51/5278 |
| | | | 313/504 |
| 2007/0009762 A1* | 1/2007 | Hamada | H01L 51/0072 |
| | | | 428/690 |
| 2007/0026257 A1 | 2/2007 | Begley et al. | |
| 2007/0046189 A1 | 3/2007 | Hatwar et al. | |
| 2009/0072725 A1 | 3/2009 | Suzuki et al. | |
| 2009/0102368 A1 | 4/2009 | Shitagaki et al. | |
| 2009/0167168 A1* | 7/2009 | Seo | H01L 51/0085 |
| | | | 313/504 |
| 2010/0213457 A1* | 8/2010 | Shitagaki | H01L 51/5052 |
| | | | 257/40 |
| 2011/0073844 A1 | 3/2011 | Pieh et al. | |
| 2011/0156059 A1* | 6/2011 | Reineke | H01L 51/5036 |
| | | | 257/79 |
| 2011/0248249 A1* | 10/2011 | Forrest | H01L 51/5036 |
| | | | 257/40 |
| 2012/0025180 A1 | 2/2012 | Matsumoto | |
| 2012/0242219 A1* | 9/2012 | Seo | C09K 11/06 |
| | | | 313/504 |
| 2012/0326132 A1 | 12/2012 | Ko et al. | |
| 2013/0069044 A1* | 3/2013 | Ma | H01L 51/504 |
| | | | 257/40 |
| 2013/0153865 A1 | 6/2013 | Kho et al. | |
| 2013/0292665 A1 | 11/2013 | Ono | |
| 2014/0061601 A1 | 3/2014 | Kim et al. | |
| 2014/0077688 A1 | 3/2014 | Weaver et al. | |
| 2014/0084274 A1 | 3/2014 | Yamazaki et al. | |
| 2014/0091289 A1* | 4/2014 | Heo | H01L 51/5072 |
| | | | 257/40 |
| 2014/0131674 A1 | 5/2014 | Park et al. | |
| 2014/0167016 A1 | 6/2014 | Yoo et al. | |
| 2014/0183475 A1* | 7/2014 | Song | H01L 51/5278 |
| | | | 257/40 |
| 2015/0034923 A1* | 2/2015 | Kim | H01L 27/3209 |
| | | | 257/40 |
| 2015/0041795 A1 | 2/2015 | Suzuki et al. | |
| 2015/0060793 A1* | 3/2015 | Song | H01L 51/5044 |
| | | | 257/40 |
| 2015/0155516 A1* | 6/2015 | Yamashita | H01L 51/56 |
| | | | 257/40 |
| 2015/0255741 A1* | 9/2015 | Lee | H01L 51/5004 |
| | | | 257/40 |
| 2015/0357596 A1 | 12/2015 | Loebl et al. | |
| 2016/0141338 A1* | 5/2016 | Li | H01L 51/5088 |
| | | | 257/40 |
| 2016/0240730 A1* | 8/2016 | Murayama | H01L 33/06 |
| 2017/0054084 A1 | 2/2017 | Kim et al. | |
| 2018/0019429 A1 | 1/2018 | Park | |
| 2019/0043407 A1 | 2/2019 | Yang | |
| 2020/0035948 A1* | 1/2020 | Song | H01L 51/0005 |

OTHER PUBLICATIONS

M. Lee et al., Efficient Green Coumarin Dopants for Organic Light-Emitting Devices, Mar. 16, 2004, Organic Letters, vol. 6, No. 8, pp. 1241-1244. (Year: 2004).*
Machine translation, Rothe, German Pat. Pub. No. DE 102010004453, translation date: Dec. 9, 2020, Espacenet, all pages. (Year: 2020).*
Kim et al. "Synthesis and Characterization of Quinoxaline Derivative as Organic Semiconductors for Organic Thin-Film Transistors" Journal of Nanoscience and Nanotechnology, vol. 17, No. 8, 2017, pp. 5530-5538.
Lee et al. "Efficient Green Coumarin Dopants for Organic Light-Emitting Devices", Organic Letters, vol. 6, No. 8, 2004, pp. 1241-1244.
Yoshida et al., "Electron Transport in Bathocuproine Interlayer in Organic Semiconductor Devices," The Journal of Physical Chemistry, vol. 119, 2015 (Published Oct. 1, 2015), pp. 24459-24464.
Zhang et al., "Concentration Quenching of Electroluminescence in Neat Ir(ppy)$_3$ Organic Light-emitting Diodes," Journal of Applied Physics, vol. 108, 2010 (Published online Oct. 22, 2010), pp. 083107-1 to 083107-5.

* cited by examiner

ORGANIC LIGHT EMITTING DISPLAY DEVICE HAVING LAYER TO CONTROL CHARGE TRANSFER

CROSS-REFERENCE TO RELATED APPLICATIONS

This application is a continuation of U.S. application Ser. No. 16/444,958 filed on Jun. 18, 2019 (now U.S. Pat. No. 10,665,807 issued on May 26, 2020), which is a continuation of U.S. application Ser. No. 15/244,871 filed on Aug. 23, 2016 (now U.S. Pat. No. 10,374,183 issued on Aug. 6, 2019), which claims the priority benefits of Korean Patent Application No. 10-2015-0162862 filed in Republic of Korea on Nov. 19, 2015 and Korean Patent Application No. 10-2016-0067756 filed in Republic of Korea on May 31, 2016, all of these applications are hereby incorporated by reference into the present application.

BACKGROUND

Field

The present disclosure relates to an organic light emitting display device, and more particularly, to an organic light emitting display device with enhanced lifetime.

Discussion of the Related Art

Recently, as society advances to the information-oriented society, the field of display devices which visually express electrical information signals is rapidly advancing. Various display devices, having excellent performance in terms of thinness, lightness, and low power consumption, are being developed correspondingly.

Examples of the display devices include liquid crystal display (LCD) devices, plasma display panel (PDP) devices, field emission display (FED) devices, organic light emitting display devices, etc.

Particularly, the organic light emitting display devices are self-emitting devices. In comparison with other display devices, the organic light emitting display devices have a fast response time, high emission efficiency, high luminance, and a wide viewing angle and thus are attracting much attention.

An example of a white organic light emitting device is discussed in Korean Patent Application No. 10-2009-0092596 (published as KR 2011-0035048).

SUMMARY

Accordingly, the present disclosure is directed to provide an organic light emitting display device that substantially obviates one or more problems due to limitations and disadvantages of the related art.

Organic light emitting devices each include an emission layer which is formed between two electrodes. An electron and a hole are injected from the two electrodes into the emission layer, and an exciton is generated by combining the electron with the hole. The organic light emitting devices are devices based on the principle that light is emitted when the generated exciton is dropped from an excited state to a ground state.

A hole transport layer or an electron transport layer may be provided for injecting the electron and the hole into the emission layer included in the organic light emitting device. Since the electron transport layer is a layer that plays an important role in adjusting a balance of electrons and holes, the electron transport layer is formed of a material, which is high in electron mobility, for enabling an electron to be smoothly injected and lowering a driving voltage.

In a case where the electron transport layer uses a material which is high in electron mobility, since an electron is quickly transferred to the emission layer, the driving voltage does not increase, but it is difficult to adjust a balance of electrons and holes in the emission layer. Therefore, a recombination zone or an emission zone where an exciton is generated is not formed in the emission layer but is provided in an interface between the hole transport layer and the emission layer. Accordingly, the emission layer cannot contribute to emit light, causing a reduction in lifetime of the emission layer. Also, when an emission zone of the emission layer is narrowed as time elapses, lifetime is further reduced.

Moreover, in a case where the electron transport layer having low electron mobility, since a balance of holes and electrons is adjusted, lifetime of the electron transport layer is enhanced, but as time elapses, lifetime of the electron transport layer reduced rapidly instead of gradually.

Therefore, the present inventor recognizes the above-described problems and has done various experiments for improving a lifetime of an organic light emitting display device by adjusting an electron mobility of an electron transport layer for optimizing a charge balance of an emission layer.

Through the various experiments, the inventor has invented an organic light emitting display device in which an electron transport layer is formed of materials which have different absolute values in a lowest unoccupied molecular orbital (LUMO) energy level, and a balance of electrons and holes in an emission layer is maintained by adjusting a content of the materials so as to enhance a lifetime of the organic light emitting display device, thereby enhancing lifetime. Also, the inventor has invented an organic light emitting display device in which a balance of electrons and holes in an emission layer is maintained by adjusting an energy bandgap of an electron transport layer and an energy bandgap of a charge generation layer adjacent to the electron transport layer so as to enhance a lifetime of the organic light emitting display device, thereby enhancing lifetime.

An aspect of the present disclosure is directed to provide an organic light emitting display device in which an electron transport layer is formed of materials which have different absolute values in the LUMO energy level, and lifetime is enhanced by adjusting a content of the materials.

Another aspect of the present disclosure is directed to provide an organic light emitting display device in which an emission control layer and an electron transport layer with adjusted electron mobility are provided, thereby enhancing lifetime.

Another aspect of the present disclosure is directed to provide an organic light emitting display device in which lifetime is enhanced by adjusting an energy bandgap of an electron transport layer and an energy bandgap of a charge generation layer adjacent to the electron transport layer.

Another aspect of the present disclosure is directed to provide an organic light emitting display device in which an energy bandgap of an electron transport layer and an energy bandgap of a charge generation layer adjacent to the electron transport layer are adjusted, and an emission control layer is provided, thereby enhancing lifetime.

The objects of the present disclosure are not limited to the aforesaid, but other objects not described herein will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device including an anode on a substrate, a first emission part that is disposed on the anode and includes a first emission layer and a first electron transfer layer, a second emission part that is disposed on the first emission part and includes a second emission layer and a second electron transfer layer, and a cathode on the second emission part. At least one among the first electron transfer layer and the second electron transfer layer may include a first material and a second material, and an absolute value of a LUMO energy level of the first material may be larger than an absolute value of a LUMO energy level of the second material.

In another aspect of the present disclosure, there is provided an organic light emitting display device including an anode on a substrate, a first emission part that is disposed on the anode and includes a first hole transfer layer, a first emission layer, and a first electron transfer layer, a second emission part that is disposed on the first emission part and includes a second hole transfer layer, a second emission layer, and a second electron transfer layer, and a cathode on the second emission part. At least one among the first emission part and the second emission part may include an emission control layer having an absolute value of a highest occupied molecular orbital (HOMO) energy level which is larger than an absolute value of a HOMO energy level of the first hole transfer layer or the second hole transfer layer.

Details of embodiments are included in a detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
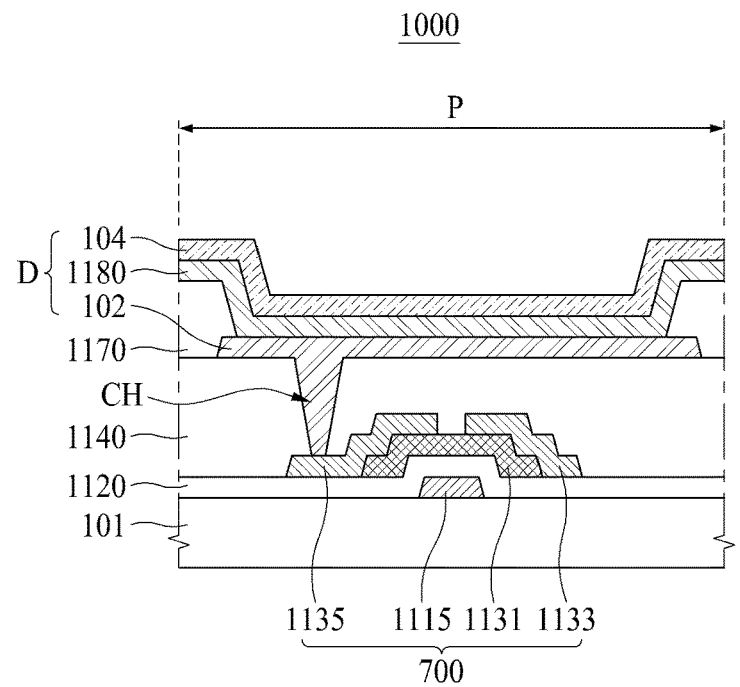
FIG. 1 is a diagram illustrating an organic light emitting display device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, embodiments of the present disclosure will be described in detail with reference to the accompanying drawings.

FIG. 1 is a diagram illustrating an organic light emitting display device 1000 according to an embodiment of the present disclosure. All the components of the organic light emitting display device according to all embodiments of the present disclosure are operatively coupled and configured.

Referring to FIG. 1, the organic light emitting display device 1000 may include a substrate 101, a thin film transistor (TFT) 700, and an organic light emitting device D. The organic light emitting display device 1000 may include a plurality of pixels P. A pixel P denotes an area corresponding to a minimum unit where light is actually emitted, and may be referred to as a subpixel or a pixel area. Also, a certain plurality of pixels P may constitute a minimum group for realizing white light. For example, three subpixels may constitute one group, namely, a red subpixel, a green subpixel, and a blue subpixel may constitute one group. Alternatively, four subpixels may constitute one group, namely, a red subpixel, a green subpixel, a blue subpixel, and a white subpixel may constitute one group. However, the present embodiment is not limited thereto, and various pixel designs may be made. In FIG. 1, for the convenience and brevity of description, only one pixel P is illustrated.

The TFT 700 may include a gate electrode 1115, a gate insulation layer 1120, a semiconductor layer 1131, a source electrode 1133, and a drain electrode 1135. The TFT 700 may be disposed on the substrate 101 and may supply a signal to the organic light emitting device D. The TFT 700 illustrated in FIG. 1 may be a driving TFT connected to a first electrode 102. A switching TFT or a capacitor for driving the organic light emitting device D may be further disposed on the substrate 101. Also, in FIG. 1, the TFT 700 is illustrated as having an inverted staggered structure, but may be formed in a coplanar structure.

The substrate 101 may be formed of an insulating material and/or a material having flexibility. The substrate 101 may be formed of glass, metal, plastic, and/or the like, but is not limited thereto. If an organic light emitting display device is a flexible organic light emitting display device, the substrate 101 may be formed of a flexible material such as plastic and/or the like. Also, if an organic light emitting device having flexibility is applied to a lighting device for vehicles or an automotive display device, various designs and a degree of freedom of design of a lighting device for vehicles are secured according to a structure or an appearance of a vehicle.

The gate electrode 1115 may be formed on the substrate 101 and may be connected to a gate line. The gate electrode 1115 may include a multilayer formed of one material among molybdenum (Mo), aluminum (Al), chromium (Cr), gold (Au), titanium (Ti), nickel (Ni), neodymium (Nd), and copper (Cu) or an alloy thereof.

The gate insulation layer 1120 may be formed on the gate electrode 1115 and may be formed of silicon oxide (SiOx), silicon nitride (SiNx), or a multilayer thereof, but is not limited thereto.

The semiconductor layer 1131 may be formed on the gate insulation layer 1120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), zinc tin oxide (ZTO), indium gallium zinc oxide (IGZO), or indium tin zinc oxide (ITZO), but is not limited thereto. Also, an etch stopper may be formed on the semiconductor layer 1131 and may protect the semiconductor layer 1131, but may be omitted depending on a configuration of a device.

The source electrode 1133 and the drain electrode 1135 may be formed on the semiconductor layer 1131. The source electrode 1133 and the drain electrode 1135 may be formed of a single layer or a multilayer, and may be formed of one material among molybdenum (Mo), aluminum (Al), chromium (Cr), gold (Au), titanium (Ti), nickel (Ni), neodymium (Nd), and copper (Cu) or an alloy thereof.

A planarization layer 1140 may be formed on the source electrode 1133 and the drain electrode 1135 and may expose a portion of the drain electrode 1135. The planarization layer 1140 may be formed of SiOx, SiNx, or a multilayer thereof. Alternatively, the planarization layer 1140 may be formed of an acryl resin or a polyimide resin, but is not limited thereto.

Moreover, a passivation layer may be further formed between the planarization layer 140 and the TFT 700. The passivation layer may be formed of an inorganic material. The passivation layer protects the TFT 700 and may expose a portion of the drain electrode 1135 similarly to the planarization layer 1140.

The first electrode 102 may be formed on the planarization layer 1140. The first electrode 102 may be formed of indium tin oxide (ITO), indium zinc oxide (IZO), or indium tin zinc oxide (ITZO) which is a transparent conductive material such as transparent conductive oxide (TCO), but is not limited thereto. If the organic light emitting display device 1000 is driven in a top emission type, the first electrode 102 may further include a reflector. Also, the first electrode 102 may be referred to as an anode or a pixel electrode.

The first electrode 102 may be electrically connected to the drain electrode 1135 through a contact hole CH which is formed in a certain area of the planarization layer 1140, and may be supplied with various signals through the TFT 700. In FIG. 1, the drain electrode 1135 is illustrated as being electrically connected to the first electrode 102, but the present embodiment is not limited thereto. As another example, the source electrode 1133 may be electrically connected to the first electrode 102 through the contact hole CH which is formed in the certain area of the planarization layer 1140.

The organic light emitting display device 1000 of FIG. 1 may be the top emission type, and in this case, light emitted from an emission part 1180 may be transferred in an up direction through the second electrode 104. Also, when the organic light emitting display device 1000 is a bottom emission type, the light emitted from an emission part 1180 may be transferred in a down direction through the first electrode 102. In this case, the TFT 700 may be disposed in an area which does not overlap the first electrode 102 or may be disposed in an area overlapping a bank layer 1170, so as not to obstruct a path of the light emitted from the emission part 1180.

A bank layer 1170 may be formed on the first electrode 102 and may divide a pixel P. The bank layer 1170 may cover an end of the first electrode 102. Referring to FIG. 1, the bank layer 1170 may expose a portion of a top of the first electrode 102. The bank layer 1170 may be formed of an organic material such as a benzocyclobutene (BCB) resin, an acryl resin, a polyimide resin, and/or the like. The bank layer 1170 may be formed of a photosensitive material having a black pigment. In this case, the bank layer 1170 may act as a light blocking member.

The organic light emitting device D may be formed at least partly on the bank layer 1170 and may include the first electrode 102, the emission part 1180, and the second electrode 104.

The second electrode 104 may be formed on the emission part 1180. The second electrode 104 may be formed of gold (Au), silver (Ag), aluminum (Al), molybdenum (Mo), magnesium (Mg), lithium (Li), calcium (Ca), lithium fluoride (LiF), indium tin oxide (ITO), indium zinc oxide (IZO), indium tin zinc oxide (ITZO), and/or the like, may be formed of an alloy thereof, or may be formed of a single layer or a multilayer. Examples of the alloy may include silver-magnesium (Ag:Mg), magnesium-lithium fluoride (Mg:LiF), etc. However, the second electrode 104 is not limited thereto. Also, the second electrode 104 may be referred to as a cathode or a common electrode.

Moreover, an encapsulation part may be further formed on the second electrode 104. The encapsulation part prevents moisture from penetrating into the emission part 1180. The encapsulation part may include a plurality of layers where different inorganic materials are stacked, or include a plurality of layers where an inorganic material and an organic material are alternately stacked. Also, an encapsulation substrate may be further formed on the encapsulation part. The encapsulation substrate may be formed of glass, plastic, or metal. The encapsulation substrate may be adhered to the encapsulation part by an adhesive.

Figure 2:
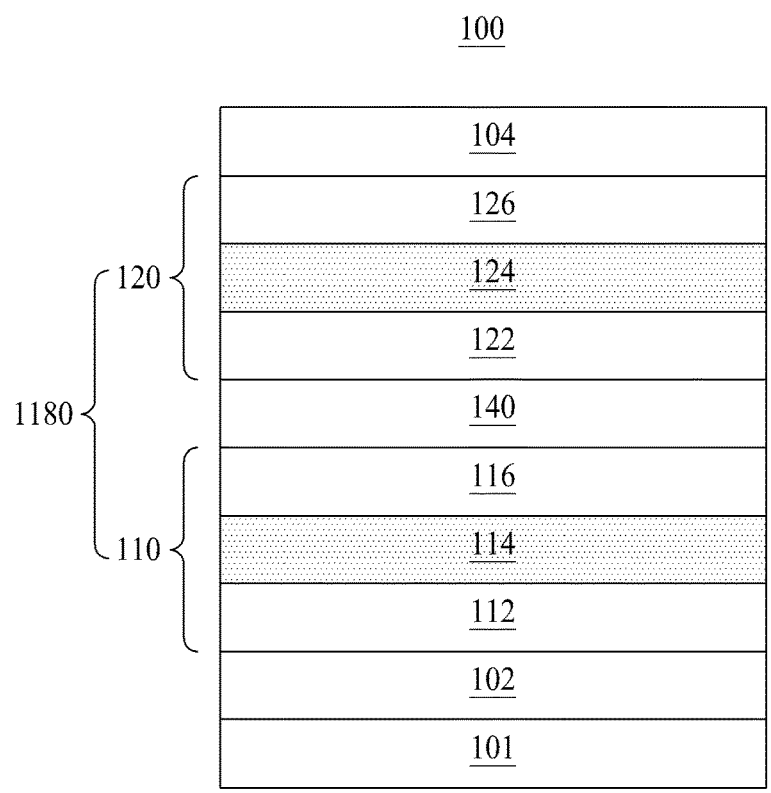
FIG. 2 is a diagram illustrating an organic light emitting device according to a first embodiment of the present disclosure.

FIG. 2 is a diagram illustrating an organic light emitting device 100 according to a first embodiment of the present disclosure. The organic light emitting device 100 in this embodiment or in any other embodiment of the present disclosure may correspond to the organic light emitting device D of FIG. 1.

The organic light emitting device 100 according to the first embodiment of the present disclosure illustrated in FIG. 2 may include a substrate 101, first and second electrodes 102 and 104, and an emission part 1180 between the first and second electrodes 102 and 104. The emission part 1180 may include a first emission part 110 and a second emission part 120.

The emission part 1180 illustrated in FIG. 2 may have a common emission layer structure and may emit white light. The emission part 1180 having the common emission layer structure may be formed by using a common mask where all pixels are opened, and may be stacked in the same structure in all pixels without patterns by pixel. That is, the emission part 1180 having the common emission layer structure may have a connection or extend from one pixel to an adjacent pixel without being broken or interrupted and may share a plurality of pixels.

The substrate 101 may be formed of an insulating material and/or a material having flexibility. The substrate 101 may be formed of glass, metal, plastic, and/or the like, but is not limited thereto.

The first electrode 102 is an anode that supplies a hole, and may be formed of a transparent conductive material having a high work function. Here, examples of the transparent conductive material may include ITO, IZO, ITZO, etc.

The second electrode 104 is a cathode that supplies an electron, and may be formed of a metal material having a relatively low work function. Examples of the metal material may include silver (Ag), titanium (Ti), aluminum (Al), molybdenum (Mo), etc.

Moreover, a capping layer may be further formed on the second electrode 104, for protecting the organic light emitting device. Also, the capping layer may be omitted depending on the structure or characteristic of the organic light emitting device.

The first emission part 110, which includes a first hole transport layer (HTL) 112, a first emission layer (EML) 114, and a first electron transport layer (ETL) 116, may be formed on the first electrode 102.

A hole supplied through the first HTL 112 and an electron supplied through the first ETL 116 may be recombined in the first EML 114 to generate an exciton. An area where the exciton is generated in the first EML 114 may be referred to as a recombination area (a recombination zone) or an emission area (an emission zone).

Moreover, the second emission part 120 which includes a second HTL 122, a second EML 124, and a second ETL 126 may be formed on the first emission part 110.

A hole supplied through the second HTL 122 and an electron supplied through the second ETL 126 may be recombined in the second EML 124 to generate an exciton. An area where the exciton is generated in the second EML 124 may be referred to as a recombination area (a recombination zone) or an emission area (an emission zone).

Moreover, a charge generation layer (CGL) 140 may be formed between the first emission part 110 and the second emission part 120. The CGL 140 may adjust a charge balance between the first emission part 110 and the second emission part 120 and may include an N-type CGL and a P-type CGL.

The first EML 114 and the second EML 124 may be emission layers that emit light of different colors. For example, the first EML 114 may be one among a red EML, a green EML, and a blue EML, and the second EML 124 may be an emission layer having a color that differs from that of the first EML 114.

In order to smoothly transfer electrons to the first EML 114 and the second EML 124, the first ETL 116 and the second ETL 126 may each be formed of a material which has high electron mobility. In this case, since the electrons are quickly transferred to the first EML 114 and the second EML 124, a driving voltage does not increase, but it is difficult to adjust a balance of electrons and holes in the first EML 114 and the second EML 124. Also, there is a problem where as time elapses, lifetime is reduced. Details where lifetime is reduced as time elapses will be described with reference to FIGS. 3A and 3B.

Figure 3A:
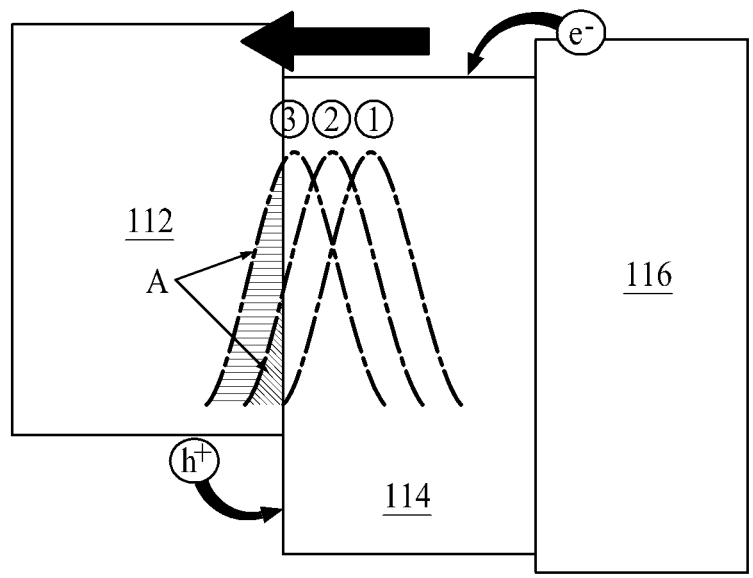
FIG. 3A is a diagram showing an energy band diagram according to the first embodiment of the present disclosure.

FIG. 3A is a diagram showing an energy band diagram according to the first embodiment of the present disclosure.

As shown in FIG. 3A, an electron (e−) supplied through the first ETL 116 and a hole (h+) supplied through the first HTL 112 may be recombined in the first EML 114 to generate an exciton. A combination area where an electron and a hole are combined in the first EML 114 may be referred to as an emission area (an emission zone) or a recombination area (a recombination zone). In FIG. 3A, an arrow indicates the direction of an increasing lifetime.

The first ETL 116 may be formed of a material, which has high electron mobility, for smoothly transferring an electron to the first EML 114 and lowering the driving voltage, and thus, as shown in FIG. 3A, an emission area of the first EML 114 may be disposed closer to a center of the first EML 114 than to the first HTL 112 (referred to by ①). Also, it can be seen that a non-emission area A appears as time elapses (referred to by ②). Furthermore, it can be seen that when time further elapses, the non-emission area A is enlarged in comparison with ② (referred to by ③). Since the non-emission area A cannot emit light, the non-emission area A cannot contribute to emission of light from the first EML 114. Therefore, it can be seen that as time elapses, the emission area is formed in or shifted to an interface between the first HTL 112 and the first EML 114, and thus, the non-emission area A incapable of contributing to emission of light from the first EML 114 is enlarged. Also, it can be seen that as time elapses, the emission area moves from the first EML 114 to the interface between the first HTL 112 and the first EML 114. That is, as time elapses, an emission position changes, and thus, lifetime is reduced.

Figure 3B:
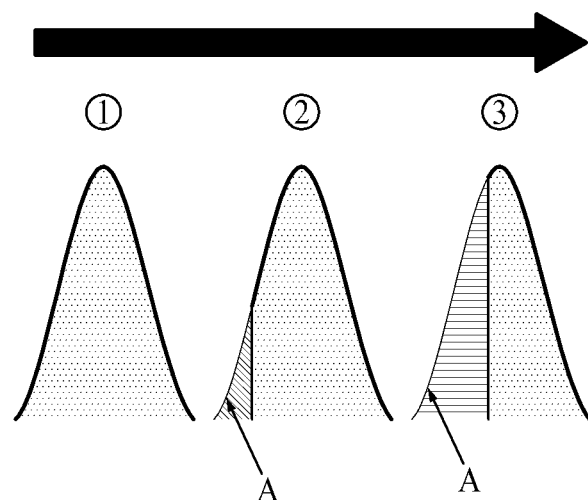
FIG. 3B is a diagram showing an emission distribution with respect to time in an emission area according to the first embodiment of the present disclosure.

FIG. 3B is a diagram showing an emission distribution with respect to time in an emission area according to the first embodiment of the present disclosure.

As illustrated in FIG. 3B, it can be seen that as time elapses (referred to by an arrow), a non-emission area A is enlarged, and thus, an emission distribution is narrowed. Therefore, as time elapses, lifetime is reduced.

As described above with reference to FIGS. 3A and 3B, as time elapses, an emission position changes, a non-emission area is enlarged, and an emission distribution is narrowed, causing a reduction in lifetime. Therefore, the inventor has recognized that a position of an emission area and an emission distribution with respect to time should be improved for enhancing a lifetime of an organic light emitting display device.

Therefore, embodiments of the present disclosure provide an organic light emitting display device in which an electron and a hole are recombined in an EML by adjusting a balance of electrons and holes, and an emission area has a broad emission distribution even when an emission position moves as time elapses, thereby enhancing lifetime.

This will be described with reference to FIG. 4.

Figure 4:
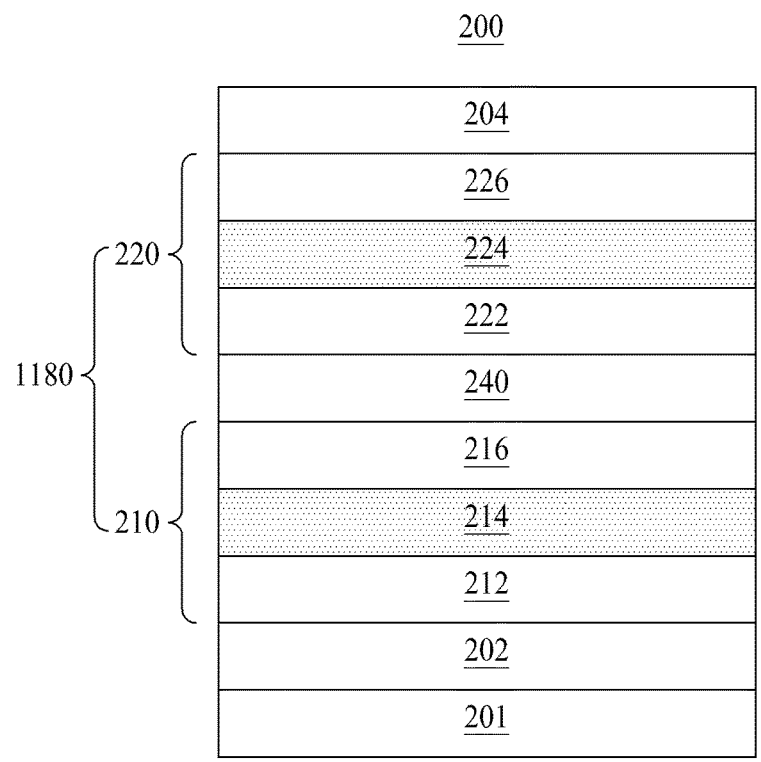
FIG. 4 is a diagram illustrating an organic light emitting device according to a second embodiment of the present disclosure.

FIG. 4 is a diagram illustrating an organic light emitting device 200 according to a second embodiment of the present disclosure. All the components of the organic light emitting device according to all the embodiments of the present disclosure are operatively coupled and configured.

The organic light emitting device 200 according to the second embodiment of the present disclosure illustrated in FIG. 4 may include a substrate 201, first and second electrodes 202 and 204, and an emission part 1180 between the first and second electrodes 202 and 204. The emission part 1180 may include a first emission part 210 and a second emission part 220.

The emission part 1180 illustrated in FIG. 4 may have a common emission layer structure and may emit white light. The emission part 1180 having the common emission layer structure may be formed by using a common mask where all pixels are opened, and may be stacked in the same structure in all pixels without being patterned for each pixel. That is, the emission part 1180 having the common emission layer structure may have a connection or extend from one pixel to an adjacent pixel without being broken or interrupted and may share a plurality of pixels.

Also, light emitted from a plurality of emission layers 214 and 224 included in the emission part 1180 may be combined to emit white light through the first electrode 202 or the second electrode 204. Alternatively, the emission part 1180 may have a patterned emission layer structure. The emission part 1180 having the patterned emission layer structure may have a structure where a plurality of emission layers (for example, a red (R) emission layer, a green (G) emission layer, and a blue (B) emission layer) which respectively emit light having different colors are divisionally provided in a plurality of pixels, respectively, and each of the plurality of pixels may emit light having a monocolor. Also, a patterned emission layer may include a monocolor. Each of the plurality of emission layers may be pattern-deposited in a corresponding pixel by using an opened mask (for example, a fine metal mask (FMM)). Therefore, the first EML 214 and the second EML 224 are illustrated in FIG. 4. However, each of the first EML 214 and the second EML 224 may be configured as a red EML, a green EML, and a blue EML disposed in each of the plurality of pixels.

The substrate 201 may be formed of an insulating material and/or a material having flexibility. The substrate 201 may be formed of glass, metal, plastic, and/or the like, but is not limited thereto. If an organic light emitting display device is a flexible organic light emitting display device, the substrate 201 may be formed of a flexible material such as plastic and/or the like. Also, if an organic light emitting device having flexibility is applied to a lighting device for vehicles, various designs and a degree of freedom of design of a light device for vehicles are secured according to a structure or an appearance of a vehicle.

The first electrode 202 is an anode that supplies a hole, and may be formed of indium tin oxide (ITO), indium zinc oxide (IZO), or the like which is a transparent conductive material such as transparent conductive oxide (TCO). Alternatively, the first electrode 202 may be formed of gold (Au), silver (Ag), aluminum (Al), molybdenum (Mo), magnesium (Mg), lithium (Li), calcium (Ca), lithium fluoride (LiF), ITO, IZO, ITZO, and/or the like, may be formed of an alloy thereof, or may be formed of a single layer or a multilayer. Examples of the alloy may include Ag:Mg, Mg:LiF, etc. However, a material of the first electrode 202 is not limited thereto.

Moreover, the first electrode 202 may include a reflective layer in order that light emitted from each of the EMLs 214 and 224 is not irradiated in a down direction through the first electrode 202. In detail, the first electrode 202 may have a three-layer structure where a first transparent layer, a reflective layer, and a second transparent layer are sequentially stacked. For example, the first transparent layer and the second transparent layer may each be formed of transparent conductive oxide (TCO) such as ITO, IZO, ITZO, or the like. The reflective layer between the two transparent layers may be formed of a metal material such as copper (Cu), silver (Ag), palladium (Pd), an Ag alloy, or the like. For example, the first electrode 202 may be formed of ITO/Ag/ITO or Ag/Pd/Cu. Alternatively, the first electrode 202 may have a two-layer structure where a transparent layer and a reflective layer are stacked.

The second electrode 204 is a cathode that supplies an electron, and may be formed of gold (Au), silver (Ag), aluminum (Al), Mo, magnesium (Mg), lithium (Li), calcium (Ca), lithium fluoride (LiF), indium tin oxide (ITO), indium zinc oxide (IZO), indium tin zinc oxide (ITZO) and/or the like, or may be formed of an alloy thereof. Alternatively, the second electrode 204 may be formed of a single layer or a multilayer. Examples of the alloy may include silver-magnesium (Ag:Mg), magnesium-lithium fluoride (Mg:LiF), etc. However, a material of the second electrode 204 is not limited thereto.

The first electrode 202 and the second electrode 204 may be referred to as an anode and a cathode, respectively. That is, the emission part 1180 may be provided between the anode and the cathode. Also, the first electrode 202 and the second electrode 204 may be referred to as a pixel electrode and a common electrode, respectively. Alternatively, the first electrode 202 may be formed as a transmissive electrode, and the second electrode 204 may be formed as a semitransmissive electrode. Alternatively, the first electrode 202 may be formed as a reflective electrode, and the second electrode 204 may be formed as a semitransmissive electrode. Alternatively, the first electrode 202 may be formed as a semitransmissive electrode, and the second electrode 204 may be formed as a transmissive electrode. Alternatively, at least one among the first and second electrodes 202 and 204 may be formed as a semitransmissive electrode.

Moreover, a capping layer may be further formed on the second electrode 204, for protecting the organic light emitting device. Also, the capping layer may be omitted depending on the structure or characteristic of the organic light emitting device.

The first emission part 210 which includes a first HTL 212, a first EML 214, and a first ETL 216 may be disposed on the first electrode 202.

A hole supplied through the first HTL 212 and an electron supplied through the first ETL 216 may be recombined in the first EML 214 to generate an exciton. An area where the exciton is generated in the first EML 214 may be referred to as a recombination area (a recombination zone) or an emission area (an emission zone).

The first HTL 212 may be formed of one or more of N,N'-bis(naphthalene-1-yl)-N,N'-bis(phenyl)-2,2'-dimethylbenzidine (NPD), N,N'-bis(naphthalene-1-yl)-N,N'-bis(phenyl)-benzidine (NPB), and N,N'-bis(3-methylphenyl)-N,N'-bis(phenyl)-benzidine (TPD), but is not limited thereto.

Moreover, a hole injection layer (HIL) may be further formed on the first electrode 202. The HIL may smoothly transfer a hole, supplied from the first electrode 202, to the first HTL 212. The HIL enables the hole to be smoothly injected. The HIL may be formed of one or more of dipyrazino[2,3-f:2',3'-h]quinoxaline-2,3,6,7,10,11-hexacarbonitrile (HAT-CN), cupper phthalocyanine (CuPc), poly(3,4)-ethylenedioxythiophene (PEDOT), N,N'-bis(naphthalen-1-yl)-N,N-bis(phenyl)2-2'-dimethylbenzidine (α-NPD), N,N'-bis(3-methylphenyl)-N,N'-bis(phenyl)-benzidine (TPD), N,N'-bis(naphthalene-1-yl)-N,N'bis(phenyl)-benzidine (NPB), 4,4',4''-tris(carbazol-9-yl)triphenylamine (TcTa), 2,2',7,7'-tetrakis(N,N-diphenylamino)-9,9-spirobifluorene (spiro-TAD), and 4,4'-bis(carbazol-9-yl)biphenyl (CBP), but is not limited thereto.

The HIL may be formed by doping a P-type dopant on a material constituting the first HTL 212. In this case, the HIL and the first HTL 212 may be formed through a continuous process using one process equipment. The P-type dopant may be formed of 2,3,5,6-tetrafluoro-7,7,8,8-tetracyanl-quinodimethane (F4-TCNQ) and/or the like, but is not limited thereto.

Moreover, the second emission part 220 which includes a second HTL 222, a second EML 224, and a second ETL 226 may be formed on the first emission part 210.

A hole supplied through the second HTL 222 and an electron supplied through the second ETL 226 may be recombined in the second EML 224 to generate an exciton. An area where the exciton is generated in the second EML 224 may be referred to as a recombination area (a recombination zone) or an emission area (an emission zone).

Moreover, the second HTL 222 may be formed of a material which is the same as that of the first HTL 212, but is not limited thereto.

Moreover, an electron injection layer (EIL) may be further formed on the second ETL 226, e.g. between the second electrode 204 and the second ETL 226. The EIL may smoothly transfer an electron, supplied from the second electrode 204, to the second ETL 226.

The first HTL 212, the second HTL 222, and the HIL may each be referred to as a hole transfer layer. Therefore, the hole transfer layer may be a layer that transfers and injects a hole to the first EML 214 and the second EML 224. Also, the first ETL 216, the second ETL 226, and the EIL may each be referred to as an electron transfer layer. Therefore, the electron transfer layer may be a layer that transfers and injects an electron to the first EML 214 and the second EML 224.

Moreover, a charge generation layer (CGL) 240 may be formed between the first emission part 210 and the second emission part 220. The CGL 240 may adjust a charge balance between the first emission part 210 and the second emission part 220 and may include an N-type CGL and/or a P-type CGL. The N-type CGL may inject an electron into the first EML 214 and may be formed of an organic layer doped with metal and/or the like, but is not limited thereto. The P-type CGL may inject a hole into the second EML 224. The P-type CGL may be formed of an organic layer including a P-type dopant, but is not limited thereto.

The first EML 214 and the second EML 224 may be EMLs that emit light of different colors. For example, the first EML 214 may be one among a red EML, a green EML, and a blue EML, and the second EML 224 may be an EML having a color that differs from that of the first EML 214. Therefore, the organic light emitting device according to an embodiment of the present disclosure may be a light emitting device that emits white light from each of the first EML 214 and the second EML 224. Alternatively, the first EML 214 and the second EML 224 may be EMLs that emit light of the same color. For example, each of the first EML 214 and the second EML 224 may be one among a red EML, a green EML, and a blue EML. Therefore, the organic light emitting device according to an embodiment of the present disclosure may be a monocolor light emitting device that emits light of the same color.

Moreover, the first EML 214 and the second EML 224 may each include at least one host and at least one dopant.

The at least one host may be a host having a hole characteristic or a host having an electron characteristic. Alternatively, the at least one host may be a mixed host including two or more kinds of hosts. If the at least one host includes two or more kinds of hosts, the at least one host may include a host having a hole characteristic and a host having an electron characteristic. Also, the at least one dopant may include a fluorescent dopant or a phosphorescent dopant.

If each of the first EML 214 and the second EML 224 is the red EML, a host constituting the red EML may include one or more host materials, and examples of the host materials may include 4,4'-bis(carbozol-9-yl)biphenyl (CBP), 1,3-bis(carbazol-9-yl)benzene (MCP), N,N'-bis (naphthalene-1-yl)-N,N'-bis(phenyl)-2,2'-dimethylbenzidine (NPD), Be complex, etc. A dopant constituting the red EML may include a phosphorescent dopant, and examples of the phosphorescent dopant may include bis(2-benzo[b]thiophen-2-yl-pyridine)(acetylacetonate)iridium(III) (Ir(btp)$_2$(acac)), bis(1-phenylisoquinoline)(acetylacetonate)iridium(III) (Ir(piq)$_2$(acac)), tris(1-phenylquinoline)iridium (III) (Ir(piq)$_3$), 5,10,15,20-tetraphenyltetrabenzoporphyrin platinum complex (Pt(TPBP)), etc. Also, the dopant constituting the red EML may be a fluorescent dopant, and examples of the fluorescent dopant may include perylene, etc. The materials of the host or the dopant constituting the red EML do not limit details of the present disclosure.

If each of the first EML 214 and the second EML 224 is the green EML, a host constituting the green EML may include one or more host materials, and examples of the host materials may include 4,4'-bis(carbozol-9-yl)biphenyl (CBP), 1,3-bis(carbazol-9-yl)benzene (MCP), N,N'-bis (naphthalene-1-yl)-N,N'-bis(phenyl)-2,2'-dimethylbenzidine (NPD), Be complex, anthracene derivatives, etc. A dopant constituting the green EML may be a phosphorescent dopant, and examples of the phosphorescent dopant may include tris(2-phenylpyridine)iridium(III) (Ir(ppy)$_3$), Bis(2-phenylpyridine)(acetylacetonate)iridium(III) (Ir(ppy)$_2$(acac)), etc. Also, the dopant constituting the green EML may be a fluorescent dopant, and examples of the fluorescent dopant may include tris(8-hydroxy-quinolinato)aluminum (Alq$_3$), etc. The materials of the host or the dopant constituting the green EML do not limit details of the present disclosure.

If each of the first EML 214 and the second EML 224 is the blue EML, a host constituting the blue EML may include one or more host materials, and examples of the host materials may include 4,4'-bis(carbozol-9-yl)biphenyl (CBP), 1,3-bis(carbazol-9-yl)benzene (MCP), 9,10-di (naphth-2-yl)anthracene (ADN), anthracene derivatives, etc. A dopant constituting the blue EML may be a phosphorescent dopant, and examples of the phosphorescent dopant may include bis(3,5-difluoro-2-(2-pyridyl)phenyl-(2-carboxypyridyl)iridium(III) (FIrpic), etc. Also, the dopant constituting the blue EML may be a fluorescent dopant, and examples of the fluorescent dopant may include polyfluorene (PFO)-based polymer, polyphenylenevinylene (PPV)-based polymer, pyrene derivatives, etc. The materials of the host or the dopant constituting the blue EML do not limit details of the present disclosure.

In the second embodiment of the present disclosure, a balance of holes and electrons in the second EML 224 is maintained by adjusting an electron mobility of the second ETL 226, there providing an organic light emitting display device with enhanced lifetime. Therefore, the second ETL 226 is formed of at least two materials which have different absolute values in a lowest unoccupied molecular orbital (LUMO) energy level, and under this condition, the inventors have done an experiment for checking whether lifetime is affected by a content of the at least two materials.

This will be described below with reference to the following Table 1 and FIG. 5.

TABLE 1

|  | Driving Voltage (V) | Efficiency (cd/A) | CIEx | CIEy |
|---|---|---|---|---|
| Comparative Example 1 | 7.5 | 12.1 | 0.135 | 0.068 |
| Experiment Example 1 | 7.7 | 10.0 | 0.135 | 0.068 |
| Experiment Example 2 | 7.7 | 12.2 | 0.135 | 0.068 |
| Experiment Example 3 | 7.9 | 11.8 | 0.135 | 0.068 |

In Table 1, the comparative example 1 and the experiment examples 1 to 3 have been experimented by applying the organic light emitting device of FIG. 4. In the comparative example 1 and the experiment examples 1 to 3, one pixel includes a red subpixel, a green subpixel, and a blue subpixel.

In the comparative example 1, the first electrode 202 is formed on the substrate 201, the first HTL 212 is formed of N,N'-bis(naphthalene-1-yl)-N,N'-bis(phenyl)-2,2'-dimethylbenzidine (NPD) and/or the like, and in an area adjacent to the substrate 201, the HIL is formed by doping 2,3,5,6-tetrofluoro-7,7,8,8-tetracyano-quinodimethane (F4-TCNQ) and/or the like.

Moreover, in a red subpixel area, the first EML 214 is formed by doping bis(2-benzo[b]thiophen-2-yl-pyridine) (acetylacetonate)iridium(III) (Ir(btp)$_2$(acac)) as a dopant on Be complex which is a red host. Also, in a green subpixel area, the first EML 214 is formed by doping Bis(2-phenylpyridine)(acetylacetonate)iridium(III) (Ir(ppy)$_2$(acac)) as a dopant on anthracene derivatives and 4,4'-bis(carbozol-9-yl)biphenyl (CBP) which are green hosts. Also, in a blue subpixel area, the first EML 214 is formed by doping pyrene derivatives as dopants on anthracene derivatives which are blue hosts.

Moreover, the first ETL 216 is formed in a whole portion of each of the red subpixel area, the green subpixel area, and the blue subpixel area. For example, the first ETL 216 may be formed one of tris(8-hydroxy-quinolinato)aluminum (Alq$_3$) and 3-(4-biphenyl)-4-phenyl-5-tert-butylpneyl-1,2,4-triazole (TAZ).

The N-type CGL 240 is formed by doping a dopant such as metal or the like on hosts that are anthracene derivatives. Also, the second HTL 222 is formed of NPD in a whole portion of each of the red subpixel area, the green subpixel area, and the blue subpixel area, and a P-type CGL is formed in an interface between the second HTL 222 and the N-type CGL by doping F4-TCNQ on NPD.

Moreover, in the red subpixel area, the second EML 224 is formed by doping bis(2-benzo[b]thiophen-2-yl-pyridine) (acetylacetonate)iridium(III) (Ir(btp)$_2$(acac)) as a dopant on Be complex which is a red host. Also, in the green subpixel area, the second EML 224 is formed by doping Bis(2-phenylpyridine)(acetylacetonate)iridium(III) (Ir(ppy)$_2$ (acac)) as a dopant on anthracene derivatives and 4,4'-bis (carbozol-9-yl)biphenyl (CBP) which are green hosts. Also, in the blue subpixel area, the second EML 224 is formed by doping pyren derivatives as dopants on anthracene derivatives which are blue hosts.

Moreover, by co-depositing Alq$_3$ and Liq at a ratio of 1:1, the second ETL 226 and the second electrode 204 are formed in a whole portion of each of the red subpixel area, the green subpixel area, and the blue subpixel area. Here, a first material of the second ETL 226 includes a material which is less in absolute value of a LUMO energy level than 8-hydroxyquinolinolato-lithium (Liq) which is a second material. That is, a first material of the second ETL 226 is one among materials having an absolute value of a LUMO energy level which is within a range of 2.40 eV to 2.60 eV, and for example, may be one among tris(8-hydroxy-quinolinato)aluminum ($Alq_3$) and 3-(4-biphenyl)-4-phenyl-5-tert-butylpneyl-1,2,4-triazole (TAZ). Also, an absolute value of a LUMO energy level of Liq which is a second material is within a range of 2.60 eV to 2.90 eV.

Moreover, a capping layer is formed of NPD. Herein, the above-described materials of the organic layers do not limit details of the present disclosure.

The experiment examples 1 to 3 are configured identically to the comparative example 1. The second ETL 226 is formed of at least two materials (for example, a first material and a second material). In this case, an absolute value of a LUMO energy level of the first material is greater than an absolute value of a LUMO energy level of the second material, and the second ETL 226 is formed by co-depositing the first material and the second material. In the at least two materials, the absolute value of the LUMO energy level of the first material has a range of 2.91 eV to 3.40 eV, and the absolute value of the LUMO energy level of the second material may have a range of 2.60 eV to 2.90 eV. Also, the first material includes one among anthracene derivatives, triazine derivatives, and carbozole derivatives, and the second material includes 8-hydroxyquinolinolato-lithium (Liq). Also, in the experiment examples 1 to 3, a ratio of the first material to the second material is differently configured. That is, a ratio of the first material to the second material is 2:1 in the experiment example 1, a ratio of the first material to the second material is 1:1 in the experiment example 2, and a ratio of the first material to the second material is 1:2 in the experiment example 3. Such a ratio corresponds to a value which is set for experiment. A ratio being 1:2 in the experiment example 3 denotes that a content of the second material is higher than that of the first material, and for example, may denote that when a sum of a weight of the first material and a weight of the second material is 100 wt %, a content of the second material exceeds 50 wt %. Also, a ratio being 1:1 in the experiment example 2 denotes that a content of the first material is equal to that of the second material.

In Table 1, color coordinates (CIEx, CIEy) represent blue color coordinates (0.135, 0.068). Table 1 shows a result that is obtained by comparing the driving voltages (V) and the efficiencies (cd/A) with respect to a current density of 5 mA/cm$^2$ in a state where the blue color coordinates are identically set.

To describe the driving voltages (V), as shown in Table 1, it can be seen that in the driving voltages (V), the experiment examples 1 to 3 increase a little in comparison with the comparative example 1. Also, it can be seen that the driving voltage of the experiment example 3 increases a little in comparison with the experiment examples 1 and 2.

To describe the efficiencies (cd/A), it can be seen that the comparative example 1, the experiment example 2, and the experiment example 3 are almost similar. Also, it can be seen that the experiment example 2 and the experiment example 3 increase further in efficiency than the experiment example 1. That is, it can be seen that efficiency further increases in the experiment examples 2 and 3, where a content of the second material is equal to or higher than that of the first material, than the experiment example 1 where a content of the second material is lower than that of the first material.

Lifetime will be described below with reference to FIG. 5. A lifetime measurement result shown in FIG. 5 has been obtained through measurement for an experiment, and a measured lifetime does not limit details of the present disclosure. Therefore, FIG. 5 shows a result obtained measuring lifetime for checking whether the lifetime is enhanced under conditions of the comparative example 1 and the experiment examples 1 to 3.

Figure 5:
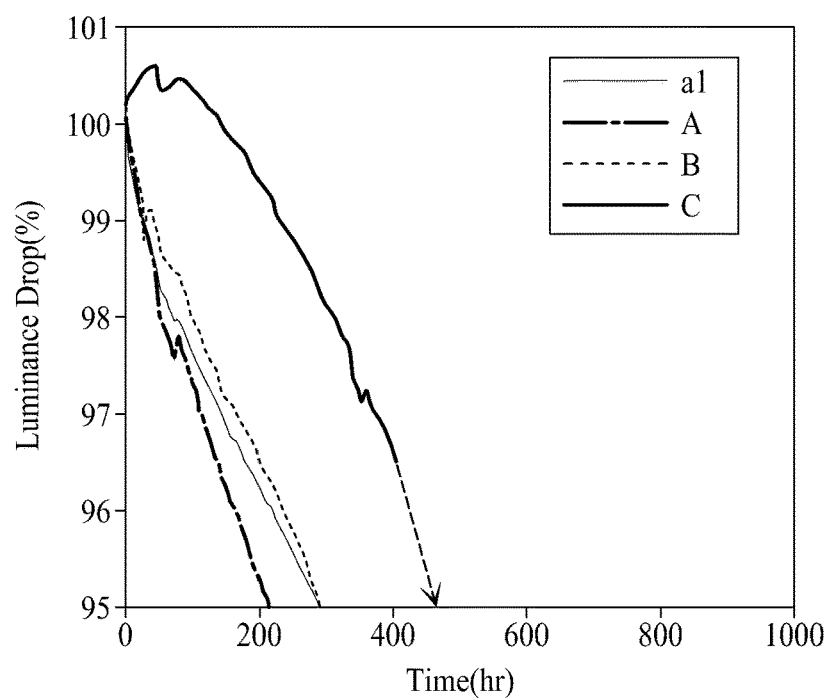
FIG. 5 is a diagram showing lifetimes in a comparative example 1 (a1) and experiment examples 1 to 3 (A, B and C)

FIG. 5 is a diagram showing lifetimes in the comparative example 1 and experiment examples 1 to 3.

In FIG. 5, the abscissa axis indicates time (hr), and the ordinate axis indicates a luminance drop rate (%). Also, the comparative example 1 is referred to as a1, the experiment example 1 is referred to as A, the experiment example 2 is referred to as B, and the experiment example 3 is referred to as C.

As shown in FIG. 5, when initial emission luminance is 100%, it can be seen that in time (i.e., a 95% lifetime (T95) of the organic light emitting device) taken until luminance is reduced by 95%, the comparative example 1 is about 210 hours, the experiment examples 1 and 2 are about 280 hours, and the experiment example 3 is about 460 hours. Therefore, it can be seen that the lifetime of the experiment example 3 increases by about 2.1 times lifetime of the comparative example 1. That is, it can be seen that the lifetime is further enhanced in the experiment example 3, where a content of the second material is higher than that of the first material, than the comparative example 1 and the experiment examples 1 and 2.

Moreover, FIG. 5 shows blue lifetime, and a total lifetime of the organic light emitting display device is enhanced further in the experiment example 3 than the comparative example 1 and the experiment examples 1 and 2.

Through such an experiment result, it can be seen that in efficiency, the comparative example 1 is almost similar to the experiment examples 1 to 3 of the present disclosure. Also, since electron mobility is lowered due to the second material having an absolute value of a LUMO energy level which is greater than an absolute value of a LUMO energy level of the first material, it can be seen that the experiment examples 1 to 3 of the present disclosure increases a little more in driving voltage than the comparative example 1.

Moreover, efficiency and a driving voltage based on a content of the first material and the second material included in the ETL in the experiment examples 1 to 3 of the present disclosure will be described below. It can be seen that the experiment examples 2 and 3 where a content of the second material is equal to or higher than that of the first material increases further in efficiency than the experiment example 1 where a content of the second material is lower than that of the first material. It can be seen that the experiment example 3 where a content of the second material is higher than that of the first material increases a little more in driving voltage than the experiment examples 1 and 2 where a content of the second material is equal to or lower than that of the first material. Also, it can be seen that the experiment example 3 where a content of the second material is higher than that of the first material is enhanced further in lifetime than the experiment examples 1 and 2 where a content of the second material is equal to or lower than that of the first material. Therefore, it can be seen that the driving voltage increases a little more, efficiency is reduced a little more, and lifetime is further enhanced in a case, where a content of the second material is higher than that of the first material, than a case where a content of the second material is equal to or lower than that of the first material. Accordingly, it can be seen that lifetime is further enhanced when an ETL is formed of two materials having different absolute values of LUMO energy levels, and a material having a relatively smaller absolute value of a LUMO energy level among the two materials is higher in content than a material having a relatively larger absolute value of a LUMO energy level.

Therefore, the ETL according to an embodiment of the present disclosure is formed of two materials having different absolute values of LUMO energy levels, and by adjusting a content of the two materials, the ETL is configured in order to reduce electron mobility. That is, an absolute value of a LUMO energy level of a first material of two different materials is adjusted higher than an absolute value of a LUMO energy level of a second material, and thus, an electron is easily injected into an EML. The absolute value of the LUMO energy level of the first material may have a range of 2.91 eV to 3.40 eV, and the absolute value of the LUMO energy level of the second material may have a range of 2.60 eV to 2.90 eV. Also, the first material is one among materials having an absolute value of a LUMO energy level which is within a range of 2.91 eV to 3.40 eV. For example, the first material may be one among anthracene derivatives, triazine derivatives, and carbozole derivatives, but is not limited thereto. The second material is one among materials having an absolute value of a LUMO energy level which is within a range of 2.60 eV to 2.90 eV, and for example, may include 8-hydroxyquinolinolato-lithium (Liq). Also, the first material and the second material are mixed through co-deposition.

Moreover, a content of the second material is adjusted higher than that of the first material, or the second material having the absolute value of the LUMO energy level is less than the absolute value of the LUMO energy level of the first material is configured higher in content than the first material, and thus, an electron mobility of an ETL is lowered, whereby an emission area where a balance of electrons and holes is formed is located in an EML. Therefore, a lifetime of the EML is enhanced. That is, since, the second material, e.g. Liq, is configured higher in content than the first material, electron mobility is lowered, and thus, the emission area where a balance of electrons and holes is formed is located in the EML, thereby enhancing lifetime. Also, a content of the second material exceeds 50 wt % in the ETL. Also, the ETL may have a thickness of about 10 nm to 40 nm. When a thickness of the ETL is less than about 10 nm, the ETL cannot act as an ETL, and when a thickness of the ETL is more than about 40 nm, a thickness of the organic light emitting device is increased, causing an increase in the driving voltage or a reduction in efficiency or lifetime.

Moreover, the first ETL 216 may each be formed of the first material and the second material of the second ETL 226. For example, the first ETL 216 may be formed of one of tris(8-hydroxy-quinolinato)aluminum (Alq$_3$), 3-(4-biphenyl)-4-phenyl-5-tert-butylpneyl-1,2,4-triazole (TAZ), 8-hydroxyquinolinolato-lithium (Liq), anthracene derivatives, triazine derivatives, and carbozole derivatives, but are not limited thereto.

Moreover, in the second embodiment of the present disclosure, the second ETL 226 has been described as an example, but the above-described details may be applied to the first ETL 216. Even in this case, lifetime is enhanced. Alternatively, the above-described details may be applied to all of the first and second ETLs 216 and 226, and even in this case, lifetime is enhanced. Therefore, at least one among the first and second ETLs 216 and 226 may be formed of two materials having different absolute values of LUMO energy levels, and an ETL formed by adjusting a content of the two materials may be applied as the first and second ETLs 216 and 226. Also, in the present embodiment, the organic light emitting device including two emission parts has been described as an example, but the above-described details may be applied to an organic light emitting device including three or more emission parts. Even in this case, the ETL according to the present embodiment may be applied.

In the second embodiment of the present disclosure, it can be seen that in the ETL, as described above, the second material having the absolute value of the LUMO energy level which is less than the absolute value of the LUMO energy level of the first material is configured higher in content than the first material, and thus, lifetime is enhanced. Also, the inventor proposes an organic light emitting device in which lifetime is not reduced despite the elapse of time, namely, despite the elapse of a long time.

Figure 6:
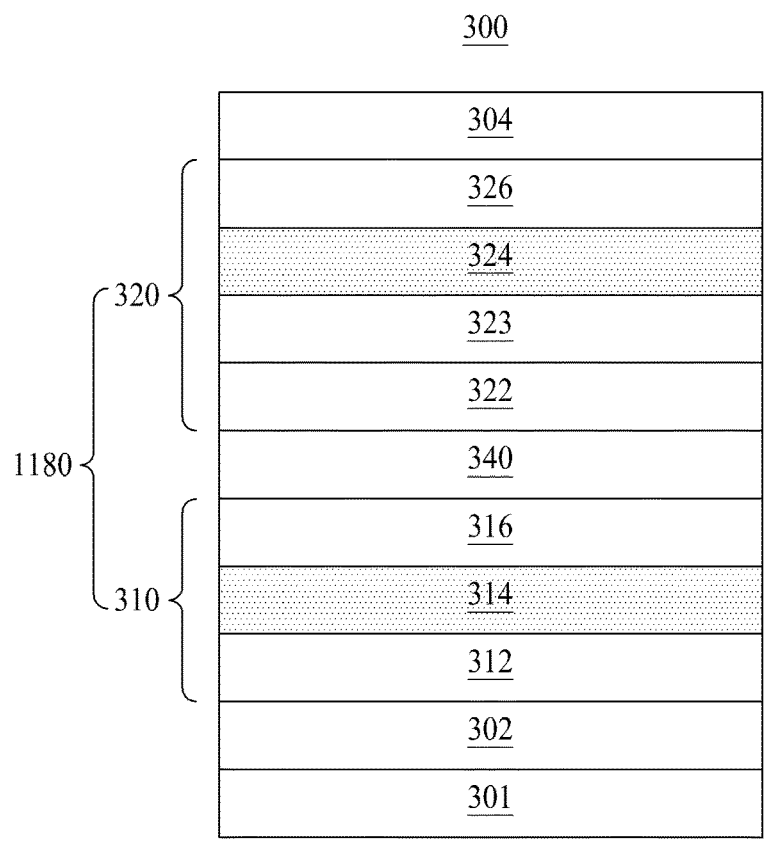
FIG. 6 is a diagram illustrating an organic light emitting device according to a third embodiment of the present disclosure.

FIG. 6 is a diagram illustrating an organic light emitting device 300 according to a third embodiment of the present disclosure. All the components of the organic light emitting device according to all the embodiments of the present disclosure are operatively coupled and configured.

Referring to FIG. 6, the organic light emitting device 300 according to the third embodiment of the present disclosure may include an emission part 1180 between a first electrode 302 and a second electrode 304. The emission part 1180 may include a first emission part 310 and a second emission part 320. A substrate 301, the first electrode 302, the first emission part 310, the emission part 1180, and the second electrode 304 illustrated in FIG. 6 may be substantially the same as the substrate 201, the first electrode 202, the first emission part 210, the emission part 1180, and the second electrode 204 described above with reference to FIG. 4. Thus, detailed descriptions of the substrate 301, the first electrode 302, the first emission part 310, the emission part 1180, and the second electrode 304 illustrated in FIG. 6 are not provided.

The first emission part 310 may include a first HTL 312, a first EML 314, and a first ETL 316 which are disposed on the first electrode 302. A hole supplied through the first HTL 312 and an electron supplied through the first ETL 316 may be recombined in the first EML 314 to generate an exciton. An area where the exciton is generated in the first EML 314 may be referred to as a recombination area (a recombination zone) or an emission area (an emission zone).

Moreover, an HIL may be further formed on the first electrode 302. The HIL may smoothly transfer a hole, supplied from the first electrode 302, to the first HTL 312. Also, the first HTL 312 may be a P-type HTL doped with a P-type dopant.

Moreover, the second emission part 320 which includes a second HTL 322, a second EML 324, an emission control layer (ECL) 323, and a second ETL 326 may be formed on the first emission part 310.

A hole supplied through the second HTL 322 and the ECL 323 and an electron supplied through the second ETL 326 may be recombined in the second EML 324 to generate an exciton. An area where the exciton is generated in the second EML 324 may be referred to as a recombination area (a recombination zone) or an emission area (an emission zone).

Moreover, an EIL may be further formed on the second ETL 326. The EIL may smoothly transfer an electron supplied from the second electrode 304 to the second ETL 326.

The first HTL 312, the second HTL 322, and the HIL may each be referred to as a hole transfer layer. Therefore, the hole transfer layer may be a layer that transfers and injects a hole to the first EML 314 and the second EML 324. Also, the first ETL 316, the second ETL 326, and the EIL may each be referred to as an electron transfer layer. Therefore, the electron transfer layer may be a layer that transfers and injects an electron to the first EML 314 and the second EML 324.

The second ETL 326 may be formed of two materials having different absolute values of LUMO energy levels, and by adjusting a content of the two materials, the second ETL 326 may be configured in order to reduce electron mobility. That is, an absolute value of a LUMO energy level of a first material of two different materials is adjusted higher than an absolute value of a LUMO energy level of a second material, and thus, an electron is easily injected into the second EML 324. The absolute value of the LUMO energy level of the first material may have a range of 2.91 eV to 3.40 eV, and the absolute value of the LUMO energy level of the second material may have a range of 2.60 eV to 2.90 eV. Also, the first material is one among materials having an absolute value of a LUMO energy level which is within a range of 2.91 eV to 3.40 eV. For example, the first material may be one of anthracene derivatives, triazine derivatives, and carbozole derivatives, but is not limited thereto. The second material is one among materials having an absolute value of a LUMO energy level which is within a range of 2.60 eV to 2.90 eV, and for example, may include 8-hydroxyquinolinato-lithium (Liq). Also, the first material and the second material may be mixed through co-deposition.

Moreover, a content of the second material is adjusted higher than that of the first material, or the second material having the absolute value of the LUMO energy level which is less than the absolute value of the LUMO energy level of the first material is configured higher in content than the first material, and thus, an electron mobility of an ETL is lowered, whereby an emission area where a balance of electrons and holes is formed is located in an EML. Therefore, lifetime of the second EML 324 is enhanced. That is, since Liq which is the second material is configured higher in content than the first material, electron mobility is lowered, and thus, the emission area where a balance of electrons and holes is formed is located in the second EML 324, thereby enhancing lifetime. Also, a content of the second material exceeds 50 wt % in the second ETL 326. Also, the second ETL 326 may have a thickness of about 10 nm to 40 nm. When a thickness of the second ETL 326 is less than about 10 nm, the second ETL 326 cannot act as an ETL, and when a thickness of the second ETL 326 is more than about 40 nm, a thickness of the organic light emitting device is increased, causing an increase in the driving voltage or a reduction in efficiency or lifetime.

Moreover, the first ETL 316 may each be formed of the first material and the second material of the second ETL 326. For example, the first ETL 316 may be formed of one of tris(8-hydroxy-quinolinato)aluminum ($Alq_3$), 3-(4-biphenyl)-4-phenyl-5-tert-butylpneyl-1,2,4-triazole (TAZ), 8-hydroxyquinolinato-lithium (Liq), anthracene derivatives, triazine derivatives, and carbozole derivatives, but are not limited thereto.

The ECL 323 may be formed of two materials which have different absolute values in LUMO energy level, and may be provided in an emission part including the second ETL 326 formed of two materials. Therefore, provided is an organic light emitting display device in which a balance of electrons and holes is adjusted in the second EML 324, lifetime is stably reduced as time elapses, and lifetime is long. That is, if the second ETL 326 and the ECL 323 are all provided, lifetime is further enhanced, and lifetime linearly changes without being changed to a bell shape as time elapses, thereby providing an organic light emitting display device having long lifetime.

The ECL 323 may be provided between the second HTL 322 and the second EML 324. An absolute value of an highest occupied molecular orbitals (HOMO) energy level of the ECL 323 may be adjusted greater than an absolute value of an HOMO energy level of the second HTL 322, and thus, the ECL 323 may act as a barrier that reduces a moving speed of a hole when the hole moves from the second HTL 322 to the second EML 324. Therefore, a balance of electrons and holes may be adjusted in the second EML 324. The absolute value of the HOMO energy level of the ECL 323 may be within a range of 5.20 eV to 5.60 eV. The absolute value of the HOMO energy level of the second HTL 322 may be within a range of 5.10 eV to 5.50 eV. Therefore, the absolute value of the HOMO energy level of the ECL 323 may be adjusted 0.10 eV to 0.50 eV higher than the absolute value of the HOMO energy level of the second HTL 322 in order that the ECL 323 has an energy barrier. Also, the ECL 323 may be formed of 2-(4-biphenyl)-5-(4-tert-butylphenyl)-1,3,4-oxadiazole (PBD), 2,9-dimethyl-4,7-diphenyl-1,10-phenthroline (BCP), 2,2',2''-(1,3,5-benzinetriyl)-tris(1-phenyl-1-H-benzimidazole) (TPBi), and/or the like, but is not limited thereto. This will be described below with reference to FIG. 7.

Figure 7:
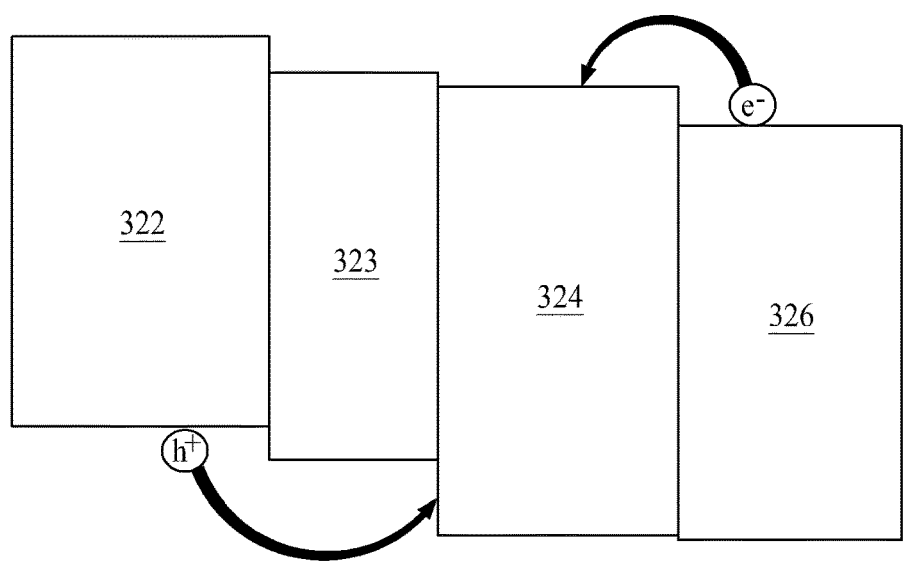
FIG. 7 is a diagram showing an energy band diagram according to the third embodiment of the present disclosure.

FIG. 7 is a diagram showing an energy band diagram according to the third embodiment of the present disclosure.

As shown in FIG. 7, an electron (e−) supplied through the second ETL 326 and a hole (h+) supplied through the second HTL 322 may be recombined in the second EML 324 to generate an exciton. A combination area where an electron and a hole are combined in the second EML 324 may be referred to as an emission area (an emission zone) or a recombination area (a recombination zone).

Moreover, an absolute value of a HOMO energy level of the ECL 323 may be adjusted greater than an absolute value of an HOMO energy level of the second HTL 322, and thus, the ECL 323 may act as a barrier that reduces a moving speed of a hole when the hole moves from the second HTL 322 to the second EML 324. Therefore, since a balance of electrons and holes is formed in the second EML 324 by the ECL 323, lifetime is enhanced, an exciton generated by a recombination of an electron and a hole is confined in the second EML 324, thereby enhancing lifetime.

Moreover, a hole mobility of the ECL 323 may be adjusted $1.0 \times 10^{-1}$ to $1.0 \times 10^{-2}$ times lower than that of the second HTL 322. That is, the hole mobility of the ECL 323 may be within a range of $1.0 \times 10^{-5}$ cm$^2$/Vs to $1.0 \times 10^{-6}$ cm$^2$/Vs. The hole mobility of the second HTL 322 may be within a range of $1.0 \times 10^{4}$ cm$^2$/Vs to $1.0 \times 10^{-5}$ cm$^2$/Vs. Since the hole mobility of the ECL 323 is adjusted lower than that of the second HTL 322, a moving speed of a hole which moves from the second HTL 322 to the second EML 324 may be adjusted, and thus, a balance of an electron and a hole in the second EML 324 may be adjusted. Therefore, a movement of an emission area of the second EML 324 caused by the elapse of time is minimized by the ECL 323, a distribution of the emission area is widened, and a problem where lifetime is reduced by the elapse of time is solved. Also, the ECL 323 may have a thickness of about 5 nm to 20 nm. If a thickness of the ECL 323 is less than about 5 nm, efficiency is reduced, and if a thickness of the ECL 323 is more than about 20 nm, a thickness of the organic light emitting device is increased, causing an increase in the driving voltage or a reduction in efficiency or lifetime.

A driving voltage, efficiency, and lifetime in the third embodiment of the present disclosure will be described below with reference to the following Table 2 and FIG. 9.

Moreover, a CGL 340 may be formed between the first emission part 310 and the second emission part 320. The CGL 340 may adjust a charge balance between the first emission part 310 and the second emission part 320 and may include an N-type CGL and/or a P-type CGL. The N-type CGL may inject an electron into the first EML 314 and may be formed of an organic layer doped with metal and/or the like, but is not limited thereto. Also, the P-type CGL may inject a hole into the second EML 324 and may be formed of an organic layer including a P-type dopant, but is not limited thereto.

The first EML 314 and the second EML 324 may be EMLs that emit light having the same color, respectively. For example, each of the first EML 314 and the second EML 324 may be one of a red EML, a green EML, and a blue EML. Therefore, the organic light emitting device according to an embodiment of the present disclosure may be a monocolor light emitting device that emits light having the same color. Alternatively, the first EML 314 and the second EML 324 may be emission layers that emit light having different colors. For example, the first EML 314 may be one of a red EML, a green EML, and a blue EML, and the second EML 324 may be an EML having a color that differs from that of the first EML 314. Also, the first EML 314 and the second EML 324 may be substantially the same as the first EML 214 and second EML 224 of FIG. 4, and thus, their detailed descriptions are not provided.

Moreover, in the third embodiment of the present disclosure, the organic light emitting device including two emission parts has been described as an example, but the above-described details may be applied to an organic light emitting device including three or more emission parts. Even in this case, the ETL and the ECL according to the third embodiment of the present disclosure may be applied.

Moreover, in the third embodiment of the present disclosure, the ECL 323 has been described above as being included in the second emission part 320, but is not limited thereto. In other embodiments, an ECL may be provided in the first emission part 310, and the ECL included in the first emission part 310 may be provided between the first HTL 312 and the first EML 314 and may have the same characteristic as that of the ECL 323 included in the second emission part 320. In this case, the first emission part 310 may be configured with the first ETL 316 having the same characteristic as that of the second ETL 326. Therefore, at least one among the first and second emission parts 310 and 320 may include an ETL and an ECL which each include two materials having different absolute values of LUMO energy levels. This will be described below with reference to FIG. 8.

Figure 8:
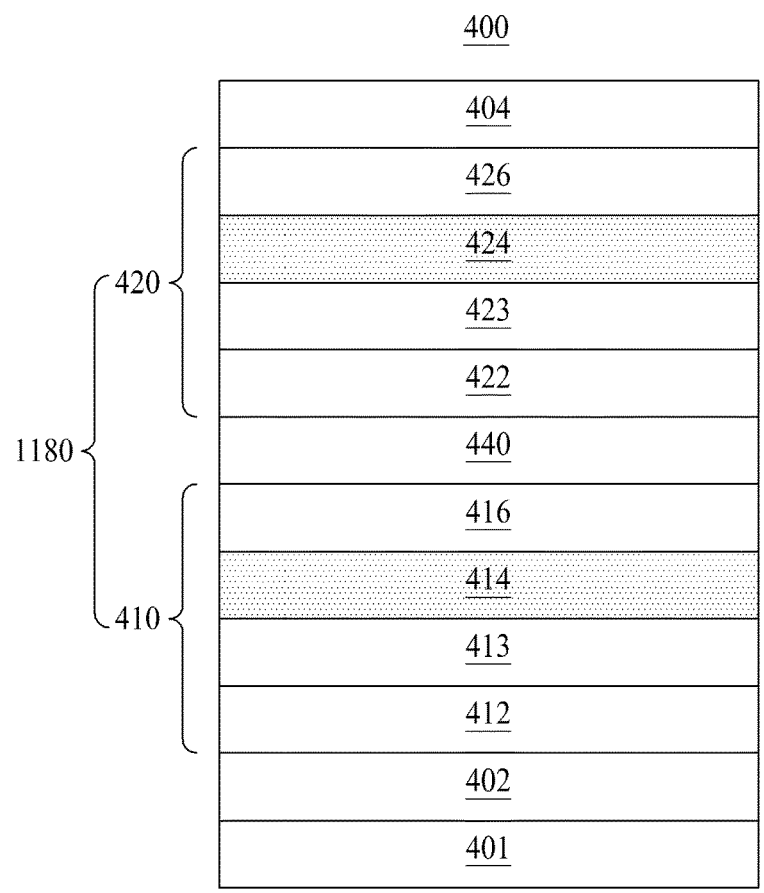
FIG. 8 is a diagram illustrating an organic light emitting device according to a fourth embodiment of the present disclosure.

FIG. 8 is a diagram illustrating an organic light emitting device 400 according to a fourth embodiment of the present disclosure. All the components of the organic light emitting device according to all the embodiments of the present disclosure are operatively coupled and configured.

Referring to FIG. 8, the organic light emitting device 400 according to the fourth embodiment of the present disclosure may include an emission part 1180 between a first electrode 402 and a second electrode 404. The emission part 1180 may include a first emission part 410 and a second emission part 420. A substrate 401, the first electrode 402, the emission part 1180, and the second electrode 404 illustrated in FIG. 8 may be substantially the same as the substrate 201, the first electrode 202, the emission part 1180, and the second electrode 204 described above with reference to FIG. 4. Thus, detailed descriptions of the substrate 401, the first electrode 402, the emission part 1180, and the second electrode 404 illustrated in FIG. 8 are not provided.

The first emission part 410 may include a first HTL 412, a first EML 414, a first ECL 413, and a first ETL 416 which are disposed on the first electrode 402.

A hole supplied through the first HTL 412 and the first ECL 413 and an electron supplied through the first ETL 416 may be recombined in the first EML 414 to generate an exciton. An area where the exciton is generated in the first EML 414 may be referred to as a recombination area (a recombination zone) or an emission area (an emission zone).

Moreover, an HIL may be further formed on the first electrode 402. The HIL may smoothly transfer a hole, supplied from the first electrode 402, to the first HTL 412. Also, the first HTL 412 may be a P-type HTL doped with a P-type dopant.

The first ECL 413 may be disposed under the first EML 414 and between the first HTL 412 and the first EML 414.

Moreover, the second emission part 420 which includes a second HTL 422, a second EML 424, a second ECL 423, and a second ETL 426 may be formed on the first emission part 410.

A hole supplied through the second HTL 422 and the second ECL 423 and an electron supplied through the second ETL 426 may be recombined in the second EML 424 to generate an exciton. An area where the exciton is generated in the second EML 424 may be referred to as a recombination area (a recombination zone) or an emission area (an emission zone).

Moreover, an EIL may be further formed on the second ETL 426. The EIL may smoothly transfer an electron, supplied from the second electrode 404, to the second ETL 426.

The second ECL 423 may be disposed between the second HTL 422 and the second EML 424.

The first HTL 412, the second HTL 422, and the HIL may each be referred to as a hole transfer layer. Therefore, the hole transfer layer may be a layer that transfers and injects a hole to the first EML 414 and the second EML 424. Also, the first ETL 416, the second ETL 426, and the EIL may each be referred to as an electron transfer layer. Therefore, the electron transfer layer may be a layer that transfers and injects an electron to the first EML 414 and the second EML 424.

The first ETL 416 and the second ETL 426 may each be formed of two materials having different absolute values of LUMO energy levels, and by adjusting a content of the two materials, the first ETL 416 and the second ETL 426 may each be configured in order to reduce electron mobility. That is, an absolute value of a LUMO energy level of a first material of two different materials is adjusted higher than an absolute value of a LUMO energy level of a second material, and thus, an electron is easily injected into the first EML 414 and the second EML 424. The absolute value of the LUMO energy level of the first material may have a range of 2.91 eV to 3.40 eV, and the absolute value of the LUMO energy level of the second material may have a range of 2.60 eV to 2.90 eV. Also, the first material is one among materials having an absolute value of a LUMO energy level which is within a range of 2.91 eV to 3.40 eV. For example, the first material may be one among anthracene derivatives, triazine derivatives, and carbozole derivatives, but is not limited thereto. The second material is one among materials having an absolute value of a LUMO energy level which is within a range of 2.60 eV to 2.90 eV, and for example, may include 8-hydroxyquinolinolato-lithium (Liq). Also, the first material and the second material may be mixed through co-deposition.

Moreover, a content of the second material is adjusted higher than that of the first material, or the second material having the absolute value of the LUMO energy level which is less than the absolute value of the LUMO energy level of the first material is configured higher in content than the first material, and thus, an electron mobility of each of the first ETL 416 and the second ETL 426 is lowered, whereby an emission area where a balance of electrons and holes is formed is located in each of the first EML 414 and the second EML 424. Therefore, a lifetime of each of the first EML 414 and the second EML 424 is enhanced. That is, since Liq which is the second material is configured higher in content than the first material, electron mobility is lowered, and thus, the emission area where a balance of electrons and holes is formed is located in each of the first EML 414 and the second EML 424, thereby enhancing lifetime. Also, a content of the second material exceeds 50 wt % in the first ETL 416 and the second ETL 426. Also, the first ETL 416 and the second ETL 426 may each have a thickness of about 10 nm to 40 nm. If a thickness of each of the first ETL 416 and the second ETL 426 is less than about 10 nm, each of the first ETL 416 and the second ETL 426 cannot act an ETL, and if a thickness of each of the first ETL 416 and the second ETL 426 is more than about 40 nm, a thickness of the organic light emitting device is increased, causing an increase in the driving voltage or a reduction in efficiency or lifetime.

The first and second ECLs 413 and 423 may be provided in at least one among the first emission part 410 and the second emission part 420. Also, the first and second ECLs 413 and 423 may be disposed under the first EML 414 and the second EML 424.

The first and second ECLs 413 and 423 may each be formed of two materials which have different absolute values in LUMO energy level, and may be provided in an emission part including the first and second ETLs 416 and 426 formed of two materials. Therefore, provided is an organic light emitting display device in which a balance of electrons and holes is adjusted in the first and second EMLs 414 and 424, lifetime is stably reduced as time elapses, and lifetime is long. That is, if the first and second ETLs 416 and 426 and the first and second ECLs 413 and 423 are all provided, lifetime is further enhanced, and lifetime linearly changes without being changed to a bell shape as time elapses, thereby providing an organic light emitting display device having long lifetime.

An absolute value of a HOMO energy level of the first ECL 413 may be adjusted greater than an absolute value of a HOMO energy level of the first HTL 412, and thus, the first ECL 413 may act as a barrier that reduces a moving speed of a hole when the hole moves from the first HTL 412 to the first EML 414. Therefore, a balance of electrons and holes is formed in the first EML 414. Accordingly, since a balance of electrons and holes is formed in the first EML 414 by the first ECL 413, lifetime is enhanced, an exciton generated by a recombination of an electron and a hole is confined in the first EML 414, thereby enhancing lifetime.

The absolute value of the HOMO energy level of the first ECL 413 may be within a range of 5.20 eV to 5.60 eV. The absolute value of the HOMO energy level of the first HTL 412 may be within a range of 5.10 eV to 5.50 eV. Therefore, the absolute value of the HOMO energy level of the first ECL 413 may be adjusted 0.10 eV to 0.50 eV higher than the absolute value of the HOMO energy level of the first HTL 412 in order that the first ECL 413 has an energy barrier. Also, the first ECL 413 may be formed of 2-(4-biphenyl)-5-(4-tert-butylphenyl)-1,3,4-oxadiazole (PBD), 2,9-dimethyl-4,7-diphenyl-1,10-phenthroline (BCP), 2,2',2"-(1,3,5-benzinetriyl)-tris(1-phenyl-1-H-benzimidazole) (TPBi), and/or the like, but is not limited thereto.

Moreover, a hole mobility of the first ECL 413 may be adjusted $1.0 \times 10^{-1}$ to $1.0 \times 10^{-2}$ times lower than that of the first HTL 412. That is, the hole mobility of the first ECL 413 may be within a range of $1.0 \times 10^{-5}$ cm$^2$/Vs to $1.0 \times 10^{-6}$ cm$^2$/Vs. The hole mobility of the first HTL 412 may be within a range of $1.0 \times 10^{-4}$ cm$^2$/Vs to $1.0 \times 10^{-5}$ cm$^2$/Vs. Since the hole mobility of the first ECL 413 is adjusted lower than that of the first HTL 412, a moving speed of a hole which moves from the first HTL 412 to the first EML 414 may be adjusted, and thus, a balance of electrons and holes in the first EML 414 may be adjusted. Therefore, a movement of an emission area of the first EML 414 caused by the elapse of time is minimized by the first ECL 413, a distribution of the emission area is widened, and a problem where lifetime is reduced by the elapse of time is solved.

The first ECL 413 may have a thickness of about 5 nm to 20 nm. If a thickness of the first ECL 413 is less than about 5 nm, efficiency is reduced, and if a thickness of the first ECL 413 is more than about 20 nm, a thickness of the organic light emitting device is increased, causing an increase in the driving voltage or a reduction in efficiency or lifetime.

The second ECL 423 may be disposed between the second HTL 422 and the second EML 424. An absolute value of a HOMO energy level of the second ECL 423 may be adjusted greater than an absolute value of an HOMO energy level of the second HTL 422, and thus, the second ECL 423 may act as a barrier that reduces a moving speed of a hole when the hole moves from the second HTL 422 to the second EML 424. Therefore, a balance of electrons and holes is formed in the second EML 424. Accordingly, since a balance of electrons and holes is adjusted in the second EML 424 by the second ECL 423, lifetime is enhanced, an exciton generated by a recombination of an electron and a hole is confined in the second EML 424, thereby enhancing lifetime.

The absolute value of the HOMO energy level of the second ECL 423 may be within a range of 5.20 eV to 5.60 eV. The absolute value of the HOMO energy level of the second HTL 422 may be within a range of 5.10 eV to 5.50 eV. Therefore, the absolute value of the HOMO energy level of the second ECL 423 may be adjusted 0.10 eV to 0.50 eV higher than the absolute value of the HOMO energy level of the second HTL 422 in order that the second ECL 423 has an energy barrier. Also, the second ECL 423 may be formed of 2-(4-biphenyl)-5-(4-tert-butylphenyl)-1,3,4-oxadiazole (PBD), 2,9-dimethyl-4,7-diphenyl-1,10-phenthroline (BCP), 2,2',2"-(1,3,5-benzinetriyl)-tris(1-phenyl-1-H-benzimidazole) (TPBi), and/or the like, but is not limited thereto.

Moreover, a hole mobility of the second ECL 423 may be adjusted $1.0 \times 10^{-1}$ to $1.0 \times 10^{-2}$ times lower than that of the second HTL 422. That is, the hole mobility of the second ECL 423 may be within a range of $1.0 \times 10^{-5}$ cm$^2$/Vs to $1.0 \times 10^{-6}$ cm$^2$/Vs. The hole mobility of the second HTL 422 may be within a range of $1.0 \times 10^{-4}$ cm$^2$/Vs to $1.0 \times 10^{-5}$ cm$^2$/Vs. Since the hole mobility of the second ECL 423 is adjusted lower than that of the second HTL 422, a moving speed of a hole which moves from the second HTL 422 to the second EML 424 may be adjusted, and thus, a balance of electrons and holes in the second EML 424 may be adjusted. Therefore, a movement of an emission area of the second EML 424 caused by the elapse of time is minimized by the second ECL 423, a distribution of the emission area is widened, and a problem where lifetime is reduced by the elapse of time is solved.

The second ECL 423 may have a thickness of about 5 nm to 20 nm. If a thickness of the second ECL 423 is less than about 5 nm, efficiency is reduced, and if a thickness of the second ECL 423 is more than about 20 nm, a thickness of the organic light emitting device is increased, causing an increase in the driving voltage or a reduction in efficiency or lifetime.

Moreover, a CGL 440 may be formed between the first emission part 410 and the second emission part 420. The CGL 440 may adjust a charge balance between the first emission part 410 and the second emission part 420 and may include an N-type CGL and/or a P-type CGL. The N-type CGL may inject an electron into the first EML 414 and may be formed of an organic layer doped with metal and/or the like, but is not limited thereto. Also, the P-type CGL may inject a hole into the second EML 424 and may be formed of an organic layer including a P-type dopant, but is not limited thereto.

The first EML 414 and the second EML 424 may be EMLs that emit light having the same color, respectively. For example, each of the first EML 414 and the second EML 424 may be one of a red EML, a green EML, and a blue EML. Therefore, the organic light emitting device according to an embodiment of the present disclosure may be a monocolor light emitting device that emits light having the same color. Alternatively, the first EML 414 and the second EML 424 may be emission layers that emit light having different colors. For example, the first EML 414 may be one of a red EML, a green EML, and a blue EML, and the second EML 424 may be an EML having a color that differs from that of the first EML 414. Also, the first EML 414 and the second EML 424 may be substantially the same as the first EML 214 and second EML 224 of FIG. 4, and thus, their detailed descriptions are not provided.

Moreover, in the fourth embodiment of the present disclosure, the organic light emitting device including two emission parts has been described as an example, but the above-described details may be applied to an organic light emitting device including three or more emission parts. Even in this case, the ETL and the ECL according to the fourth embodiment of the present disclosure may be applied.

In a case where an ETL and an ECL are provided, a driving voltage, efficiency, and lifetime will be described below with reference to the following Table 2 and FIG. 9.

The following Table 2 shows a result obtained by measuring a driving voltage, efficiency, and color coordinates in experiment examples 4 to 7.

TABLE 2

| | Driving Voltage (V) | Efficiency (cd/A) | CIEx | CIEy |
|---|---|---|---|---|
| Experiment Example 4 | 7.5 | 13.7 | 0.135 | 0.068 |
| Experiment Example 5 | 7.7 | 14.0 | 0.135 | 0.068 |
| Experiment Example 6 | 7.9 | 14.0 | 0.135 | 0.068 |
| Experiment Example 7 | 8.1 | 13.6 | 0.135 | 0.068 |

In Table 2, the experiment examples 4 to 7 have been experimented by applying the organic light emitting device of FIG. 6.

The experiment example 4 is configured identically to the comparative example 1. In the experiment example 4, the ECL 323 is formed before forming the second EML 324 in a red subpixel area, a green subpixel area, and a blue subpixel area.

The experiment example 5 is configured identically to the comparative example 1. In the experiment example 5, the ECL 323 is formed before forming the second EML 324 in a red subpixel area, a green subpixel area, and a blue subpixel area.

The experiment example 6 is configured identically to the experiment example 2. In the experiment example 6, the ECL 323 is formed before forming the second EML 324 in a red subpixel area, a green subpixel area, and a blue subpixel area.

The experiment example 7 is configured identically to the experiment example 3. In the experiment example 7, the ECL 323 is formed before forming the second EML 324 in a red subpixel area, a green subpixel area, and a blue subpixel area.

In Table 2, color coordinates (CIEx, CIEy) represent blue color coordinates (0.135, 0.068). Table 2 shows a result that is obtained by comparing the driving voltages (V) and the efficiencies (cd/A) with respect to a current density of 5 mA/cm$^2$ in a state where the blue color coordinates are identically set.

To describe the driving voltages (V), as shown in Table 2, it can be seen that in the driving voltages (V), the experiment examples 5 to 7 increase a little in comparison with the experiment example 4.

To describe the efficiencies (cd/A), since an ECL is further provided in an ETL, it can be seen that the experiment examples 4 to 7 are enhanced further in efficiency than the comparative example 1 and the experiment examples 1 to 3. That is, it can be seen that efficiency is further enhanced in the experiment example 6, where an ETL and an ECL each include a first material having an absolute value of a LUMO energy level greater than an absolute value of a LUMO energy level of Liq (a second material) and in which a content of the first material is equal to that of the second material, than the experiment 4 where the ETL and the ECL each include a first material having an absolute value of a LUMO energy level less than the absolute value of the LUMO energy level of Liq (the second material) and in which a content of the first material is equal to that of the second material. Through this, it can be seen that efficiency is further enhanced when the ETL is formed of a material having an absolute value of a LUMO energy level greater than the absolute value of the LUMO energy level of Liq, and the ECL is further formed. Also, it can be seen that the experiment examples 5 and 6 increase further in efficiency than the experiment example 7. Through this, it can be seen that efficiency further increases in the experiment examples 5 and 6, where a content of the second material is equal to or lower than that of the first material, than the experiment example 7 where a content of the second material is higher than that of the first material.

Lifetime will be described below with reference to FIG. 9. A lifetime measurement result shown in FIG. 9 has been obtained through measurement for an experiment, and a measured lifetime does not limit details of the present disclosure. Therefore, FIG. 9 shows a result obtained measuring lifetime for checking whether lifetime is enhanced under conditions of the experiment examples 4 to 7.

Figure 9:
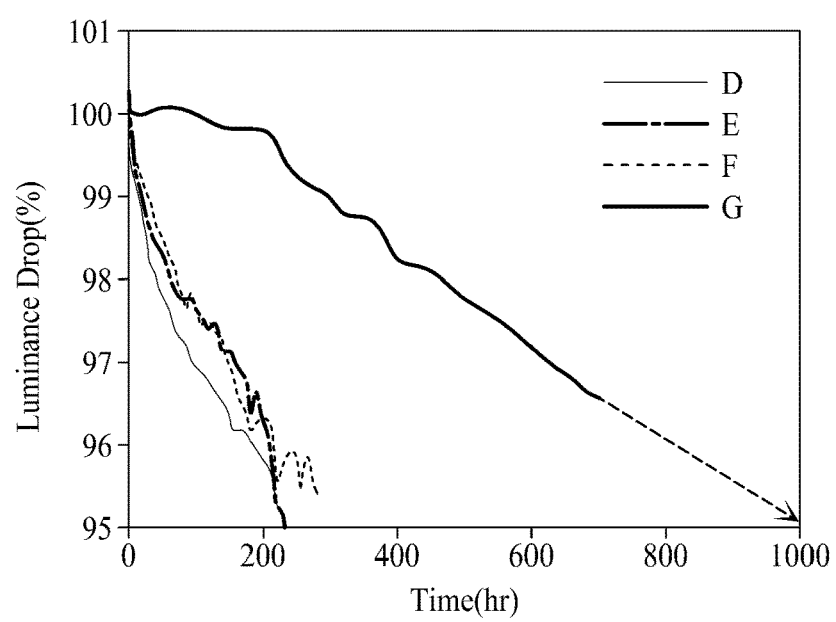
FIG. 9 is a diagram showing lifetimes in experiment examples 4 to 7 (D, E, F and G) of the present disclosure.

FIG. 9 is a diagram showing lifetimes in the experiment examples 4 to 7 of the present disclosure.

In FIG. 9, the abscissa axis indicates time (hr), and the ordinate axis indicates a luminance drop rate (%). Also, the experiment example 4 is referred to as D, the experiment example 5 is referred to as E, the experiment example 6 is referred to as F, and the experiment example 7 is referred to as G.

As shown in FIG. 9, when initial emission luminance is 100%, it can be seen that in time (i.e., a 95% lifetime (T95) of the organic light emitting device) taken until luminance is reduced by 95%, the experiment examples 4 and 5 are about 220 hours, the experiment example 6 is about 320 hours, and the experiment example 7 is about 1,000 hours. Therefore, it can be seen that the lifetime of the experiment example 7 increases by about 4.5 times lifetime of the experiment example 4. That is, it can be seen that lifetime is far more enhanced in the experiment example 7, where a content of the second material is higher than that of the first material, than the experiment examples 4 to 6.

Moreover, FIG. 9 shows blue lifetime, and a total lifetime of the organic light emitting display device is enhanced further in the experiment example 7 than the experiment examples 4 to 6.

In the third embodiment of the present disclosure, the ECL is provided, and efficiency, a driving voltage, and lifetime based on a content of the first material and the second material included in the ETL will be described below. It can be seen that efficiency further increases in the experiment examples 5 and 6, where a content of the second material is equal to or lower than that of the first material, than the experiment example 7 where a content of the second material is higher than that of the first material. It can be seen that the driving voltage increases a little more in the experiment example 7, where a content of the second material is higher than that of the first material, than the experiment examples 5 and 6 where a content of the second material is equal to or lower than that of the first material. Therefore, it can be seen that the driving voltage increases a little more, efficiency is reduced a little more, and lifetime is further enhanced in a case, where the ECL is provided and a content of the second material is higher than that of the first material, than a case where a content of the second material is equal to or lower than that of the first material. That is, in comparison with FIG. 5 showing a case where an ETL including two materials having different mobility in the second embodiment of the present disclosure, it can be seen that as time elapses, lifetime is reduced, namely, a bell shape is not shown. Accordingly, it can be seen that lifetime is further enhanced when an ETL is formed of two materials having different absolute values of LUMO energy levels, a material having a relatively smaller absolute value of a LUMO energy level among the two materials is higher in content than a material having a relatively larger absolute value of a LUMO energy level, and an ECL is provided. That is, it can be seen that as time elapses, a bell-shaped lifetime becomes linear, and thus, lifetime is further improved.

The third embodiment of the present disclosure has been described above with reference to Table 2 and FIG. 9, but according to the fourth embodiment of the present disclosure where an ETL and an ECL are respectively applied to two emission parts, a lifetime of an organic light emitting display device is also enhanced.

An energy band diagram and an emission distribution with respect to time, according to the second and third embodiments of the present disclosure, will be described below. Details where lifetime is enhanced by an ETL or an ETL and an ECL according to an embodiment of the present disclosure will be described below with reference to FIGS. 10A and 10B.

Figure 10A:
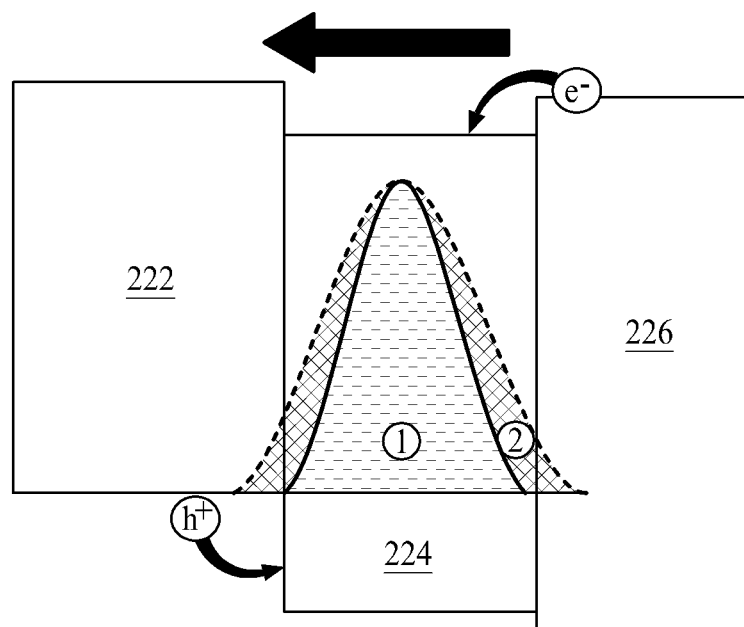
FIG. 10A is a diagram showing an energy band diagram according to the second embodiment of the present disclosure and an energy band diagram according to the third embodiment of the present disclosure.

FIG. 10A is a diagram showing an energy band diagram according to the second embodiment of the present disclosure and an energy band diagram according to the third embodiment of the present disclosure. Reference numerals in the second embodiment of the present disclosure may be applied to FIG. 10A.

As shown in FIG. 10A, an electron (e−) supplied through the second ETL 226 and a hole (h+) supplied through the second HTL 222 may be recombined in the second EML 224 to generate an exciton. A combination area where an electron and a hole are combined in the second EML 224 may be referred to as an emission area (an emission zone) or a recombination area (a recombination zone). In FIG. 10A, an arrow indicates that time increases.

In FIG. 10A, ① refers to the experiment example 3 of the second embodiment of the present disclosure, and the second ETL 226 is formed of at least two materials. In this case, the second ETL 226 is configured through co-deposition so that an absolute value of a LUMO energy level of a first material is larger than an absolute value of a LUMO energy level of a second material, and a content of the second material is higher than that of the first material. Also, ② refers to the experiment example 7 of the third embodiment of the present disclosure, and in this case, the second ETL 226 of the experiment example 3 of the second embodiment of the present disclosure is provided, and an ECL is provided between the second EML 224 and the second HTL 222.

As shown in FIG. 10A, in ① and ②), it can be seen that as time elapses, an emission area of the second EML 224 is located in the second EML 224. That is, in embodiments 2 and 3 of the present disclosure where an ETL is formed of two materials having different absolute values of LUMO energy levels, it can be seen that the emission area of the second EML 224 is not close to the second HTL 222 but is located in the second EML 224. Also, it can be seen that as time elapses, an emission position does not change. Also, it can be seen that as time elapses, a non-emission area does not appear.

Figure 10B:
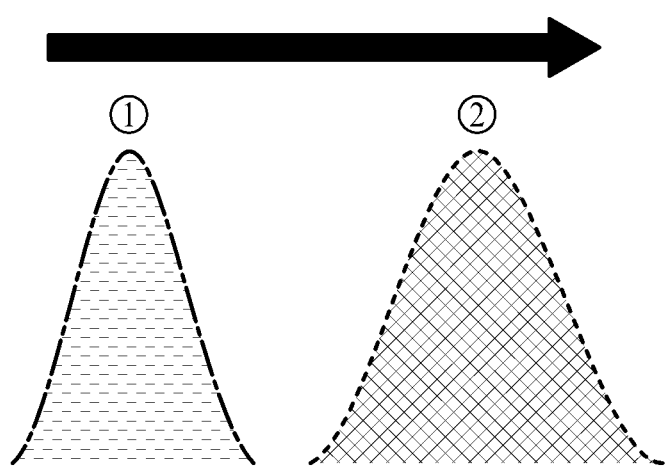
FIG. 10B is a diagram showing an emission distribution with respect to time in an emission area according to the second embodiment and the third embodiment of the present disclosure.

FIG. 10B is a diagram showing an emission distribution with respect to time in an emission area according to the second embodiment and the third embodiment of the present disclosure.

As shown in FIG. 10B, it can be seen that an emission distribution is wider in ② than ①. That is, it can be seen that despite the elapse of time, the emission distribution is wider in ② than ① due to an ECL.

As described above with reference to FIGS. 10A and 10B, in the second embodiment of the present disclosure, it can be seen that due to an ETL where an absolute value of a LUMO energy level of a first material is larger than an absolute value of a LUMO energy level of a second material, and a content of the second material is higher than that of the first material, as time elapses, a non-emission area does not appear, and an emission position is maintained. Also, in the third embodiment of the present disclosure where the ETL of the second embodiment of the present disclosure and ECL are provided, since the emission area is widened as time elapses, lifetime is not reduced despite the elapse of time, namely, despite the elapses of a long time, and thus, lifetime is further enhanced.

The emission positions and the emission distributions according to the second and third embodiments of the present disclosure have been described above with reference to FIGS. 10A and 10B. However, even in a case where the fourth embodiment of the present disclosure is applied, as time elapses, an emission position is maintained, and an emission area is widened, whereby lifetime is not reduced despite the elapse of time.

In the second to fourth embodiments of the present disclosure, the organic light emitting display device where lifetime is enhanced by adjusting a LUMO energy level included in an ETL has been described above. The present disclosure proposes an organic light emitting display device where lifetime is enhanced by adjusting a LUMO energy level of an ETL and a LUMO energy level of a CGL adjacent to the ETL. This will be described below with reference to FIG. 11.

Figure 11:
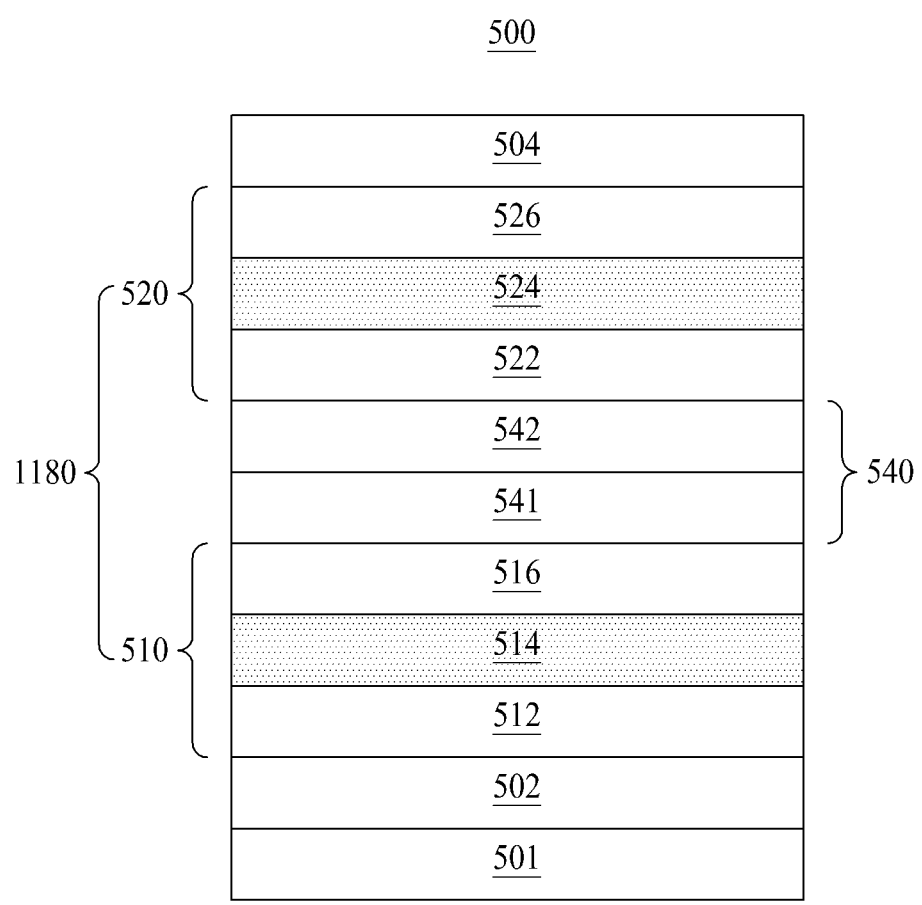
FIG. 11 is a diagram illustrating an organic light emitting device according to a fifth embodiment of the present disclosure.

FIG. 11 is a diagram illustrating an organic light emitting device 500 according to a fifth embodiment of the present disclosure. All the components of the organic light emitting device according to all the embodiments of the present disclosure are operatively coupled and configured.

Referring to FIG. 11, the organic light emitting device 500 according to the fifth embodiment of the present disclosure may include a substrate 501, first and second electrodes 502 and 504, and an emission part 1180 between the first and second electrodes 502 and 504. The emission part 1180 may include a first emission part 510 and a second emission part 520. The substrate 501, the first electrode 502, the emission part 1180, and the second electrode 504 illustrated in FIG. 11 may be substantially the same as the substrate 201, the first electrode 202, the emission part 1180, and the second electrode 204 described above with reference to FIG. 4. Thus, detailed descriptions of the substrate 501, the first electrode 502, the emission part 1180, and the second electrode 504 illustrated in FIG. 11 are not provided.

The first emission part 510 may include a first HTL 512, a first EML 514, and a first ETL 516 which are disposed on the first electrode 502. A hole supplied through the first HTL 512 and an electron supplied through the first ETL 516 may be recombined in the first EML 514 to generate an exciton. An area where the exciton is generated in the first EML 514 may be referred to as a recombination area (a recombination zone) or an emission area (an emission zone).

Moreover, an HIL may be further formed on the first electrode 502. The HIL may smoothly transfer a hole, supplied from the first electrode 502, to the first HTL 512. Also, the first HTL 512 may be a P-type HTL doped with a P-type dopant.

Moreover, the second emission part 520 which includes a second HTL 522, a second EML 524, and a second ETL 526 may be formed on the first emission part 510.

A hole supplied through the second HTL 522 and an electron supplied through the second ETL 526 may be recombined in the second EML 524 to generate an exciton. An area where the exciton is generated in the second EML 524 may be referred to as a recombination area (a recombination zone) or an emission area (an emission zone).

The second ETL 526 may be formed of one among tris(8-hydroxy-quinolinato)aluminum (Alq$_3$), 3-(4-biphenyl)-4-phenyl-5-tert-butylphenyl-1,2,4-triazole (TAZ), 8-hydroxyquinolinato-lithium (Liq), anthracene derivatives, triazine derivatives, and carbozole derivatives, but is not limited thereto.

Moreover, an EIL may be further formed on the second ETL 526. The EIL may smoothly transfer an electron, supplied from the second electrode 504, to the second ETL 526.

The first HTL 512, the second HTL 522, and the HIL may each be referred to as a hole transfer layer. Therefore, the hole transfer layer may be a layer that transfers and injects a hole to the first EML 514 and the second EML 524. Also, the first ETL 516, the second ETL 526, and the EIL may each be referred to as an electron transfer layer. Therefore, the electron transfer layer may be a layer that transfers and injects an electron to the first EML 514 and the second EML 524.

Moreover, a CGL 540 may be formed between the first emission part 510 and the second emission part 520. The CGL 540 may adjust a charge balance between the first emission part 510 and the second emission part 520 and may include an N-type CGL 541 and a P-type CGL 542. The N-type CGL 541 may inject an electron into the first EML 514 and may be formed of an organic layer doped with metal and/or the like, but is not limited thereto. Also, the P-type CGL 542 may inject a hole into the second EML 524 and may be formed of an organic layer including a P-type dopant, but is not limited thereto.

The first EML 514 and the second EML 524 may be EMLs that emit light having the same color. For example, each of the first EML 514 and the second EML 524 may be one among a red EML, a green EML, and a blue EML. Therefore, the organic light emitting device according to an embodiment of the present disclosure may be a monocolor light emitting device that emits light having the same color. Alternatively, the first EML 514 and the second EML 524 may be EMLs that emit light having different colors. For example, the first EML 514 may be one among a red EML, a green EML, and a blue EML, and the second EML 524 may be an EML having a color that differs from that of the first EML 514. Also, the first EML 514 and the second EML 524 may be substantially the same as the first EML 214 and second EML 224 of FIG. 4, and thus, their detailed descriptions are not provided.

Moreover, an energy bandgap of the N-type CGL 541 adjacent to the first ETL 516 may be adjusted for adjusting an electron mobility of the first ETL 516. That is, an energy bandgap of the first ETL 516 may be configured higher than an energy bandgap of a host included in the N-type CGL 541, and thus, the electron mobility of the first ETL 516 is reduced.

Therefore, the energy bandgap of the first ETL 516 may be configured 0.50 eV higher than an energy bandgap of a host included in the N-type CGL 541, for adjusting the electron mobility of the first ETL 516. That is, the energy bandgap of the first ETL 516 may be configured 0.50 eV to 1.00 eV higher than the energy bandgap included in the N-type CGL 541. Here, the energy bandgap may denote a difference between an absolute value of a HOMO energy level and an absolute value of a LUMO energy level. That is, an absolute value of a HOMO energy level of a host included in the N-type CGL 541 may be 5.80 eV, an absolute value of a LUMO energy level may be within a range of 2.90 eV to 3.20 eV, and an energy bandgap may be within a range of 2.60 eV to 2.90 eV. Also, an absolute value of a HOMO energy level of the first ETL 516 may be 5.60 eV, an absolute value of a LUMO energy level may be within a range of 2.00 eV to 2.50 eV, and an energy bandgap may be within a range of 3.10 eV to 3.60 eV. Therefore, the first ETL 516 may include a material having an absolute value of a LUMO energy level which is within a range of 2.00 eV to 2.50 eV, and for example, the material may be one among anthracene derivatives, triazine derivatives, and carbozole derivatives. Also, a host included in the N-type CGL 541 may include a material having an absolute value of a LUMO energy level which is within a range of 2.90 eV to 3.20 eV, and for example, the material may be anthracene derivatives. Also, the first ETL 516 may have a thickness of about 5 nm to 30 nm. If a thickness of the first ETL 516 is less than about 5 nm, the first ETL 516 cannot act as an ETL, and if a thickness of the first ETL 516 is more than about 30 nm, a thickness of the organic light emitting device is increased, causing an increase in the driving voltage or a reduction in efficiency or lifetime.

Therefore, since the electron mobility of the first ETL 516 is reduced, a balance of electrons and holes in the first EML 514 may be adjusted, thereby enhancing lifetime.

Moreover, in the fifth embodiment of the present disclosure, the organic light emitting device including two emission parts has been described as an example, but the above-described details may be applied to an organic light emitting device including three or more emission parts. Even in this case, the ETL according to the fifth embodiment of the present disclosure may be applied.

Figure 12:
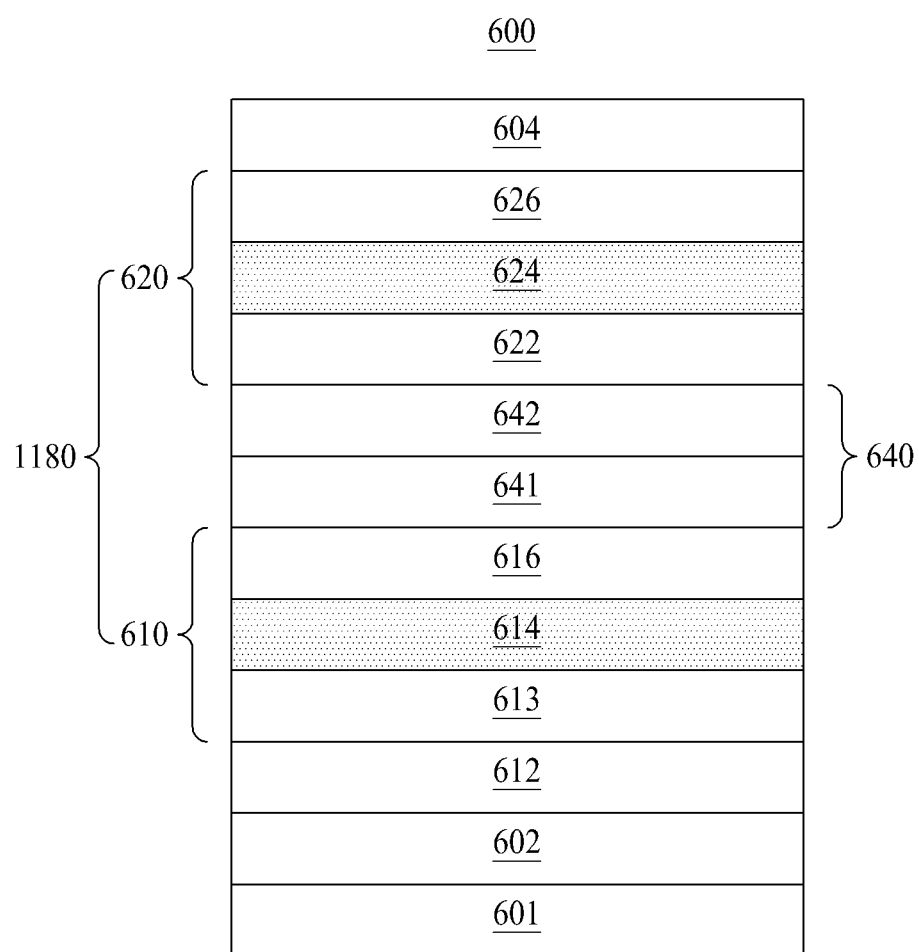
FIG. 12 is a diagram illustrating an organic light emitting device according to a sixth embodiment of the present disclosure.

FIG. 12 is a diagram illustrating an organic light emitting device 600 according to a sixth embodiment of the present disclosure. All the components of the organic light emitting device according to all the embodiments of the present disclosure are operatively coupled and configured.

Referring to FIG. 12, the organic light emitting device 600 according to the sixth embodiment of the present disclosure may include a substrate 601, first and second electrodes 602 and 604, and an emission part 1180 between the first and second electrodes 602 and 604. The emission part 1180 may include a first emission part 610 and a second emission part 620. The substrate 601, the first electrode 602, the emission part 1180, and the second electrode 604 illustrated in FIG. 12 may be substantially the same as the substrate 201, the first electrode 202, the emission part 1180, and the second electrode 204 described above with reference to FIG. 4. Thus, detailed descriptions of the substrate 601, the first electrode 602, the emission part 1180, and the second electrode 604 illustrated in FIG. 12 are not provided.

The first emission part 610 may include a first HTL 612, an ECL 613, a first EML 614, and a first ETL 616 which are disposed on the first electrode 602.

A hole supplied through the first HTL 612 and the ECL 613 and an electron supplied through the first ETL 616 may be recombined in the first EML 614 to generate an exciton. An area where the exciton is generated in the first EML 614 may be referred to as a recombination area (a recombination zone) or an emission area (an emission zone).

Moreover, an HIL may be further formed on the first electrode 602. The HIL may smoothly transfer a hole, supplied from the first electrode 602, to the first HTL 612. Also, the first HTL 612 may be a P-type HTL doped with a P-type dopant.

Moreover, the second emission part 620 which includes a second HTL 622, a second EML 624, and a second ETL 626 may be formed on the first emission part 610.

A hole supplied through the second HTL 622 and an electron supplied through the second ETL 626 may be recombined in the second EML 624 to generate an exciton. An area where the exciton is generated in the second EML 624 may be referred to as a recombination area (a recombination zone) or an emission area (an emission zone).

The second ETL 626 may be formed of one among tris(8-hydroxy-quinolinato)aluminum (Alq$_3$), 3-(4-biphenyl)-4-phenyl-5-tert-butylphenyl-1,2,4-triazole (TAZ), 8-hydroxyquinolinolato-lithium (Liq), anthracene derivatives, triazine derivatives, and carbozole derivatives, but is not limited thereto.

Moreover, an EIL may be further formed on the second ETL 626. The EIL may smoothly transfer an electron, supplied from the second electrode 604, to the second ETL 626.

The first HTL 612, the second HTL 622, and the HIL may each be referred to as a hole transfer layer. Therefore, the hole transfer layer may be a layer that transfers and injects a hole to the first EML 614 and the second EML 624. Also, the first ETL 616, the second ETL 626, and the EIL may each be referred to as an electron transfer layer. Therefore, the electron transfer layer may be a layer that transfers and injects an electron to the first EML 614 and the second EML 624.

Moreover, a CGL 640 may be formed between the first emission part 610 and the second emission part 620. The CGL 640 may adjust a charge balance between the first emission part 610 and the second emission part 620 and may include an N-type CGL 641 and a P-type CGL 642. The N-type CGL 641 may inject an electron into the first EML 614 and may be formed of an organic layer doped with metal and/or the like, but is not limited thereto. Also, the P-type CGL 642 may inject a hole into the second EML 624. The P-type CGL 642 may be formed of an organic layer including a P-type dopant, but is not limited thereto.

The first EML 614 and the second EML 624 may be EMLs that emit light having the same color. For example, each of the first EML 614 and the second EML 624 may be one among a red EML, a green EML, and a blue EML. Therefore, the organic light emitting device according to an embodiment of the present disclosure may be a monocolor light emitting device that emits light having the same color. Alternatively, the first EML 614 and the second EML 624 may be EMLs that emit light having different colors. For example, the first EML 614 may be one among a red EML, a green EML, and a blue EML, and the second EML 624 may be an EML having a color that differs from that of the first EML 614. Also, the first EML 614 and the second EML 624 may be substantially the same as the first EML 214 and second EML 224 of FIG. 4, and thus, their detailed descriptions are not provided.

The first ETL 616 may be substantially the same as the first ETL 516 described above with reference to FIG. 11, and thus, its detailed description is omitted or will be brief.

The ECL 613 may be provided in an emission part including the first ETL 616 having an energy bandgap shifted higher than that of a host included in the CGL 640. Therefore, provided is an organic light emitting display device in which a balance of electrons and holes is adjusted in the first EML 614, lifetime is stably reduced as time elapses, and lifetime is long. That is, if the first ETL 616 and the ECL 613 are all provided, lifetime is further enhanced, and lifetime linearly changes without being changed to a bell shape as time elapses, thereby providing an organic light emitting display device having long lifetime.

The ECL 613 may be disposed under the first EML 614 and between the first HTL 612 and the first EML 614. A movement of an emission area of the first EML 614 caused by the elapse of time is minimized by the ECL 613, a distribution of the emission area is widened, and a problem where lifetime is reduced by the elapse of time is solved.

An energy band diagram of each of the ECL 613, the first ETL 616, and the N-type CGL 641 will be described below with reference to FIG. 13.

Figure 13:
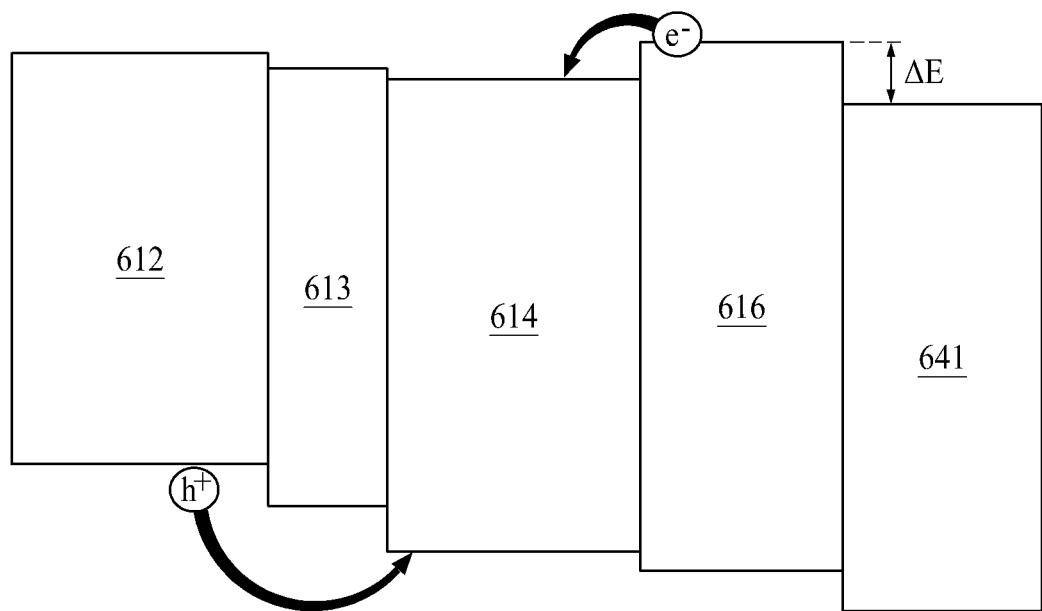
FIG. 13 is a diagram showing an energy band diagram according to the sixth embodiment of the present disclosure.

FIG. 13 is a diagram showing an energy band diagram according to the sixth embodiment of the present disclosure.

As shown in FIG. 13, an electron (e−) supplied through the first ETL 616 and a hole (h+) supplied through the first HTL 612 and the ECL 613 may be recombined in the first EML 614 to generate an exciton. A combination area where an electron and a hole are combined in the first EML 614 may be referred to as an emission area (an emission zone) or a recombination area (a recombination zone).

As illustrated in FIG. 13, a difference (ΔE) between an energy bandgap of the first ETL 616 and an energy bandgap included in the N-type CGL 641 may be adjusted to 0.50 eV to 1.00 eV for adjusting an electron mobility of the first ETL 616. Therefore, a balance of electrons and holes in the first EML 614 may be formed by reducing the electron mobility of the first ETL 616, thereby enhancing lifetime.

Moreover, an absolute value of a HOMO energy level of the ECL 613 may be adjusted greater than an absolute value of an HOMO energy level of the first HTL 612, and thus, the ECL 613 may act as a barrier that reduces a moving speed of a hole when the hole moves from the first HTL 612 to the first EML 614. Therefore, since a balance of electrons and holes is formed in the first EML 614 by the ECL 613, lifetime is enhanced, an exciton generated by a recombination of an electron and a hole is confined in the first EML 614, thereby enhancing lifetime.

An absolute value of a HOMO energy level of the ECL 613 may be within a range of 5.20 eV to 5.60 eV. An absolute value of a HOMO energy level of the first HTL 612 may be within a range of 5.10 eV to 5.50 eV. Therefore, the absolute value of the HOMO energy level of the ECL 613 may be adjusted 0.10 eV to 0.50 eV higher than the absolute value of the HOMO energy level of the first HTL 612 in order for the ECL 613 to have an energy barrier. Also, a hole mobility of the ECL 613 may be adjusted $1.0\times10^{-1}$ to $1.0\times10^{-2}$ times lower than that of the first HTL 612. That is, the hole mobility of the ECL 613 may be within a range of $1.0\times10^{-5}$ cm$^2$/Vs to $1.0\times10^{-6}$ cm$^2$/Vs. The hole mobility of the first HTL 612 may be within a range of $1.0\times10^{-4}$ cm$^2$/Vs to $1.0\times10^{-5}$ cm$^2$/Vs. Since the hole mobility of the ECL 613 is adjusted lower than that of the first HTL 612, a moving speed of a hole which moves from the first HTL 612 to the first EML 614 may be adjusted, and thus, a balance of electrons and holes in the first EML 614 may be adjusted. Therefore, a movement of an emission area of the first EML 614 caused by the elapse of time is minimized by the ECL 613, a distribution of the emission area is widened, and a problem where lifetime is reduced by the elapse of time is solved.

Figure 14:
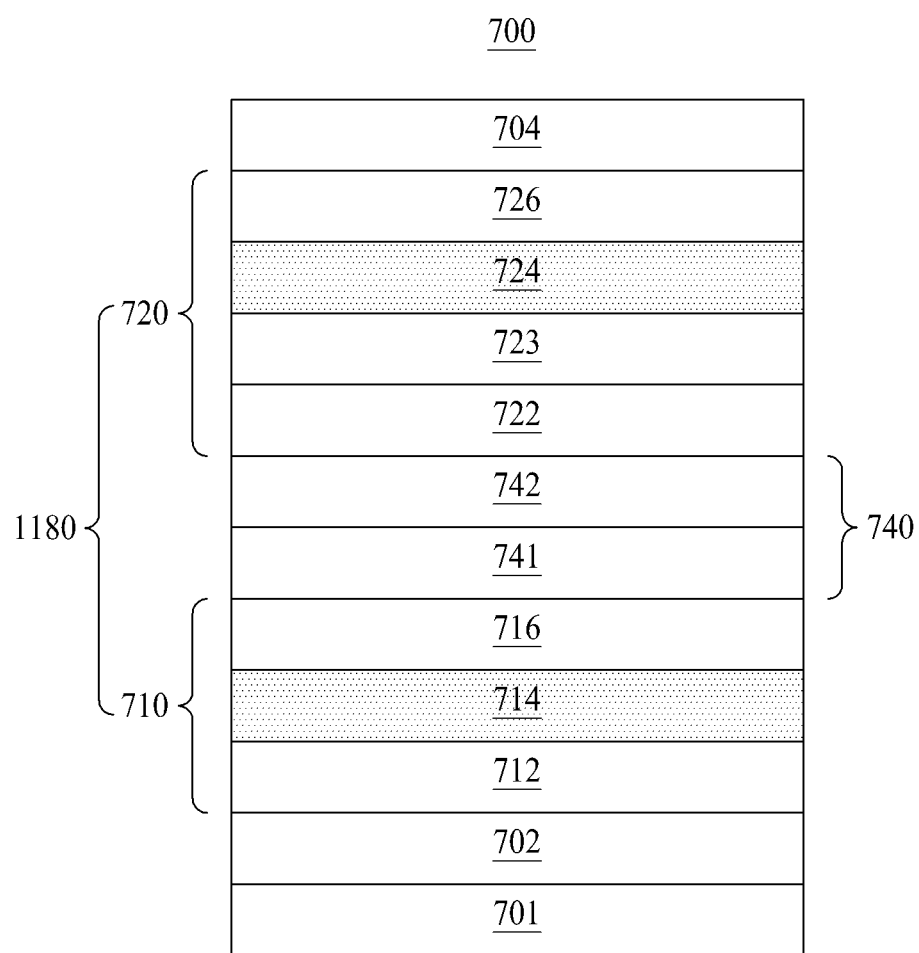
FIG. 14 is a diagram illustrating an organic light emitting device according to a seventh embodiment of the present disclosure.

FIG. 14 is a diagram illustrating an organic light emitting device 700 according to a seventh embodiment of the present disclosure. All the components of the organic light emitting device according to all the embodiments of the present disclosure are operatively coupled and configured.

Referring to FIG. 14, the organic light emitting device 700 according to the seventh embodiment of the present disclosure may include a substrate 701, first and second electrodes 702 and 704, and an emission part 1180 between the first and second electrodes 702 and 704. The emission part 1180 may include a first emission part 710 and a second emission part 720. The substrate 701, the first electrode 702, the emission part 1180, and the second electrode 704 illustrated in FIG. 14 may be substantially the same as the substrate 201, the first electrode 202, the emission part 1180, and the second electrode 204 described above with reference to FIG. 4. Thus, detailed descriptions of the substrate 701, the first electrode 702, the emission part 1180, and the second electrode 704 illustrated in FIG. 14 are not provided.

The first emission part 710 may include a first HTL 712, a first EML 714, and a first ETL 716 which are disposed on the first electrode 702. A hole supplied through the first HTL 712 and an electron supplied through the first ETL 716 may be recombined in the first EML 714 to generate an exciton. An area where the exciton is generated in the first EML 714 may be referred to as a recombination area (a recombination zone) or an emission area (an emission zone).

Moreover, an HIL may be further formed on the first electrode 702. The HIL may smoothly transfer a hole, supplied from the first electrode 702, to the first HTL 712. Also, the first HTL 712 may be a P-type HTL doped with a P-type dopant.

Moreover, the second emission part 720 which includes a second HTL 722, a second EML 724, an ECL 723, and a second ETL 726 may be formed on the first emission part 710.

A hole supplied through the second HTL 722 and the ECL 723 and an electron supplied through the second ETL 726 may be recombined in the second EML 724 to generate an exciton. An area where the exciton is generated in the second EML 724 may be referred to as a recombination area (a recombination zone) or an emission area (an emission zone).

Moreover, an EIL may be further formed on the second ETL 726. The EIL may smoothly transfer an electron, supplied from the second electrode 704, to the second ETL 726.

The first HTL 712, the second HTL 722, and the HIL may each be referred to as a hole transfer layer. Therefore, the hole transfer layer may be a layer that transfers and injects a hole to the first EML 714 and the second EML 724. Also, the first ETL 716, the second ETL 726, and the EIL may each be referred to as an electron transfer layer. Therefore, the electron transfer layer may be a layer that transfers and injects an electron to the first EML 714 and the second EML 724.

The second ETL 726 may be substantially the same as the second ETL 326 described above with reference to FIG. 6, and thus, its detailed description is omitted.

The ECL 723 may be provided in one among the first emission part 710 and the second emission part 720. The ECL 723 may be provided in the second emission part 720. The ECL 723 may be disposed under the first EML 724 and between the second HTL 722 and the second EML 724.

Moreover, the ECL 723 may be formed of two materials which have different absolute values in LUMO energy level, and may be provided in an emission part including the second ETL 726 formed of two materials. Therefore, provided is an organic light emitting display device in which a balance of electrons and holes is adjusted in the second EML 724, lifetime is stably reduced as time elapses, and lifetime is long. That is, if the second ETL 726 and the ECL 723 are all provided, lifetime is further enhanced, and lifetime linearly changes without being changed to a bell shape as time elapses, thereby providing an organic light emitting display device having long lifetime.

The ECL 723 may be substantially the same as the ECL 323 described above with reference to FIG. 6, and thus, its detailed description is omitted.

Moreover, a CGL 740 may be formed between the first emission part 710 and the second emission part 720. The CGL 740 may adjust a charge balance between the first emission part 710 and the second emission part 720 and may include an N-type CGL 741 and a P-type CGL 742.

The first EML 714 and the second EML 724 may be EMLs that emit light having the same color. For example, each of the first EML 714 and the second EML 724 may be one among a red EML, a green EML, and a blue EML. Therefore, the organic light emitting device according to an embodiment of the present disclosure may be a monocolor light emitting device that emits light having the same color. Alternatively, the first EML 714 and the second EML 724 may be EMLs that emit light having different colors. For example, the first EML 714 may be one among a red EML, a green EML, and a blue EML, and the second EML 724 may be an EML having a color that differs from that of the first EML 714. Also, the first EML 714 and the second EML 724 may be substantially the same as the first EML 214 and second EML 224 of FIG. 4, and thus, their detailed descriptions are not provided.

Moreover, an energy bandgap of the N-type CGL 741 adjacent to the first ETL 716 may be adjusted for adjusting an electron mobility of the first ETL 716. That is, an energy bandgap of the first ETL 716 may be configured higher than an energy bandgap of a host included in the N-type CGL 741, and thus, the electron mobility of the first ETL 716 is reduced. The first ETL 716 may be substantially the same as the first ETL 516 described above with reference to FIG. 11, and thus, its detailed description is omitted.

A driving voltage, efficiency, and lifetime in the seventh embodiment of the present disclosure will be described below with reference to the following Table 3 and FIG. 16.

Moreover, in the seventh embodiment of the present disclosure, the organic light emitting device including two emission parts has been described as an example, but the above-described details may be applied to an organic light emitting device including three or more emission parts. Even in this case, the ETL according to the seventh embodiment of the present disclosure may be applied.

Figure 15:
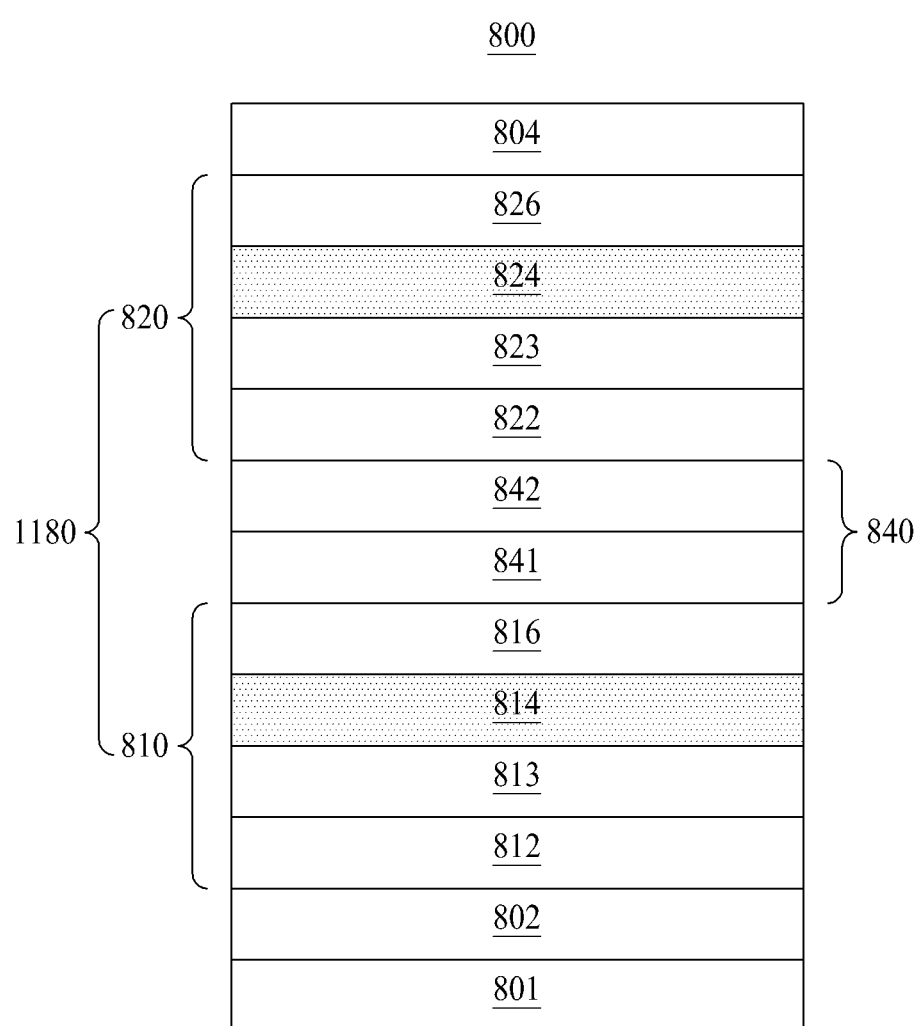
FIG. 15 is a diagram illustrating an organic light emitting device according to an eighth embodiment of the present disclosure.

FIG. 15 is a diagram illustrating an organic light emitting device 800 according to an eighth embodiment of the present disclosure. All the components of the organic light emitting device according to all the embodiments of the present disclosure are operatively coupled and configured.

Referring to FIG. 15, the organic light emitting device 800 according to the eighth embodiment of the present disclosure may include a substrate 801, first and second electrodes 802 and 804, and an emission part 1180 between the first and second electrodes 802 and 804. The emission part 1180 may include a first emission part 810 and a second emission part 820. The substrate 801, the first electrode 802, the emission part 1180, and the second electrode 804 illustrated in FIG. 15 may be substantially the same as the substrate 201, the first electrode 202, the emission part 1180, and the second electrode 204 described above with reference to FIG. 4. Thus, detailed descriptions of the substrate 801, the first electrode 802, the emission part 1180, and the second electrode 804 illustrated in FIG. 15 are not provided.

The first emission part 810 may include a first HTL 812, a first ECL 813, a first EML 814, and a first ETL 816 which are disposed on the first electrode 802. A hole supplied through the first HTL 812 and the first ECL 813 and an electron supplied through the first ETL 816 may be recombined in the first EML 814 to generate an exciton. An area where the exciton is generated in the first EML 814 may be referred to as a recombination area (a recombination zone) or an emission area (an emission zone).

Moreover, an HIL may be further formed on the first electrode 802. The HIL may smoothly transfer a hole, supplied from the first electrode 802, to the first HTL 812.

The first ECL 813 may be disposed between the first HTL 812 and the first EML 814. The first ECL 813 may be substantially the same as the ECL 613 described above with reference to FIGS. 12 and 13, and thus, its detailed description is omitted.

Moreover, the second emission part 820 which includes a second HTL 822, a second EML 824, a second ECL 823, and a second ETL 826 may be formed on the first emission part 810.

A hole supplied through the second HTL 822 and the second ECL 823 and an electron supplied through the second ETL 826 may be recombined in the second EML 824 to generate an exciton. An area where the exciton is generated in the second EML 824 may be referred to as a recombination area (a recombination zone) or an emission area (an emission zone).

Moreover, an EIL may be further formed on the second ETL 826. The EIL may smoothly transfer an electron, supplied from the second electrode 804, to the second ETL 826.

The first HTL 812, the second HTL 822, and the HIL may each be referred to as a hole transfer layer. Therefore, the hole transfer layer may be a layer that transfers and injects a hole to the first EML 814 and the second EML 824. Also, the first ETL 816, the second ETL 826, and the EIL may each be referred to as an electron transfer layer. Therefore, the electron transfer layer may be a layer that transfers and injects an electron to the first EML 814 and the second EML 824.

The second ETL 826 may be substantially the same as the second ETL 326 described above with reference to FIG. 6, and thus, its detailed description is omitted.

The second ECL 823 may be substantially the same as the ECL 323 described above with reference to FIG. 6, and thus, its detailed description is omitted.

Moreover, a CGL 840 may be formed between the first emission part 810 and the second emission part 820. The CGL 840 may adjust a charge balance between the first emission part 810 and the second emission part 820 and may include an N-type CGL 841 and a P-type CGL 842. The N-type CGL 841 may inject an electron into the first EML 814 and may be formed of an organic layer doped with metal and/or the like, but is not limited thereto. Also, the P-type CGL 842 may inject a hole into the second EML 824. The P-type CGL 842 may be formed of an organic layer including a P-type dopant, but is not limited thereto.

The first EML 814 and the second EML 824 may be EMLs that emit light having the same color. For example, each of the first EML 814 and the second EML 824 may be one among a red EML, a green EML, and a blue EML. Therefore, the organic light emitting device according to an embodiment of the present disclosure may be a monocolor light emitting device that emits light having the same color. Alternatively, the first EML 814 and the second EML 824 may be EMLs that emit light having different colors. For example, the first EML 814 may be one among a red EML, a green EML, and a blue EML, and the second EML 824 may be an EML having a color that differs from that of the first EML 814. Also, the first EML 814 and the second EML 824 may be substantially the same as the first EML 214 and second EML 224 of FIG. 4, and thus, their detailed descriptions are not provided.

Moreover, an electron mobility of the first ETL 816 may be reduced by adjusting an energy bandgap of a host included in each of the first ETL 816 and the N-type CGL 841. The energy bandgap of the first ETL 816 may be configured 0.50 eV higher than an energy bandgap of a host included in the N-type CGL 841. That is, the energy bandgap of the first ETL 816 may be configured 0.50 eV to 1.00 eV higher than the energy bandgap included in the N-type CGL 841. Also, the first ETL 816 may be substantially the same as the first ETL 516 described above with reference to FIG. 11, and thus, its detailed description is omitted.

The first and second ECLs 813 and 823 may be provided in at least one among the first emission part 810 and the second emission part 820. Also, the first and second ECLs 813 and 823 may be disposed under the first EML 814 and the second EML 824.

The ECL 813 may be provided in an emission part including the first ETL 816 having an energy bandgap shifted higher than that of a host included in the CGL 840. Therefore, provided is an organic light emitting display device in which a balance of electrons and holes is adjusted in the first EML 814, lifetime is stably reduced as time elapses, and lifetime is long. That is, if the first ETL 816 and the first ECL 813 are all provided, lifetime is further enhanced, and lifetime linearly changes without being changed to a bell shape as time elapses, thereby providing an organic light emitting display device having long lifetime.

Moreover, the second ECL 823 may be formed of two materials which have different absolute values in LUMO energy level, and may be provided in an emission part including the second ETL 826 formed of two materials. Therefore, provided is an organic light emitting display device in which a balance of electrons and holes is adjusted in the second EML 824, lifetime is stably reduced as time elapses, and lifetime is long. That is, if the second ETL 826 and the second ECL 823 are all provided, lifetime is further enhanced, and lifetime linearly changes without being changed to a bell shape as time elapses, thereby providing an organic light emitting display device having long lifetime.

A driving voltage, efficiency, and lifetime in the eighth embodiment of the present disclosure will be described below with reference to the following Table 3 and FIG. 17.

The following Table 3 shows a result obtained by measuring a driving voltage, efficiency, and color coordinates in a comparative example 2 and the seventh and eighth embodiments of the present disclosure.

TABLE 3

|  | Driving Voltage (V) | Efficiency (cd/A) | CIEx | CIEy |
|---|---|---|---|---|
| Comparative Example 2 | 7.3 | 11.8 | 0.135 | 0.068 |
| Experiment Example 8 | 7.6 | 10.9 | 0.135 | 0.068 |
| Experiment Example 9 | 7.4 | 13.5 | 0.135 | 0.068 |

In Table 3, the comparative example 2 has been experimented by applying the organic light emitting device of FIG. 2.

The comparative example 2 is configured identically to the comparative example 1. In the comparative example 2, the first ETL 716 is formed of a material where a difference between an energy bandgap of the first ETL 716 and an energy bandgap of a host included in the N-type CGL 741 is 0.40 eV.

The experiment example 8 corresponds to the seventh embodiment of the present disclosure and is configured identically to the experiment example 7. In the experiment example 8, the first ETL 716 is formed of a material where the difference between the energy bandgap of the first ETL 716 and the energy bandgap of the host included in the N-type CGL 741 is 0.50 eV.

The experiment example 9 corresponds to the eighth embodiment of the present disclosure and is configured identically to the seventh embodiment of the present disclosure. In the experiment example 9, the first ECL 813 is formed before forming the first EML 814 in a red subpixel area, a green subpixel area, and a blue subpixel area.

In Table 3, color coordinates (CIEx, CIEy) represent blue color coordinates (0.135, 0.068). Table 3 shows a result that is obtained by comparing the driving voltages (V) and the efficiencies (cd/A) with respect to a current density of 5 mA/cm$^2$ in a state where the blue color coordinates are identically set.

To describe the driving voltages (V), as shown in Table 3, it can be seen that in the driving voltages (V), the experiment example 8 increases a little in comparison with the comparative example 2 and the experiment example 9.

To describe the efficiencies (cd/A), since an ECL is further provided in an ETL, it can be seen that the experiment example 9 corresponding to the eighth embodiment of the present disclosure is enhanced further in efficiency than the experiment example 8 corresponding to the seventh embodiment of the present disclosure. That is, it can be seen that efficiency is further enhanced in a case where the first ETL 816 is configured so that a difference between an energy bandgap of the first ETL 816 and an energy bandgap of a host included in the N-type CGL 841 is 0.50 eV or more and the ECL is further provided.

Lifetime will be described below with reference to FIGS. 16 and 17. A lifetime measurement result shown in each of FIGS. 16 and 17 has been obtained through measurement for an experiment, and a measured lifetime does not limit details of the present disclosure. Therefore, FIGS. 16 and 17 show results obtained measuring lifetime for checking whether lifetime is enhanced under conditions of the experiment example 8 corresponding to the seventh embodiment of the present disclosure and the experiment example 9 corresponding to the eighth embodiment of the present disclosure.

Figure 16:
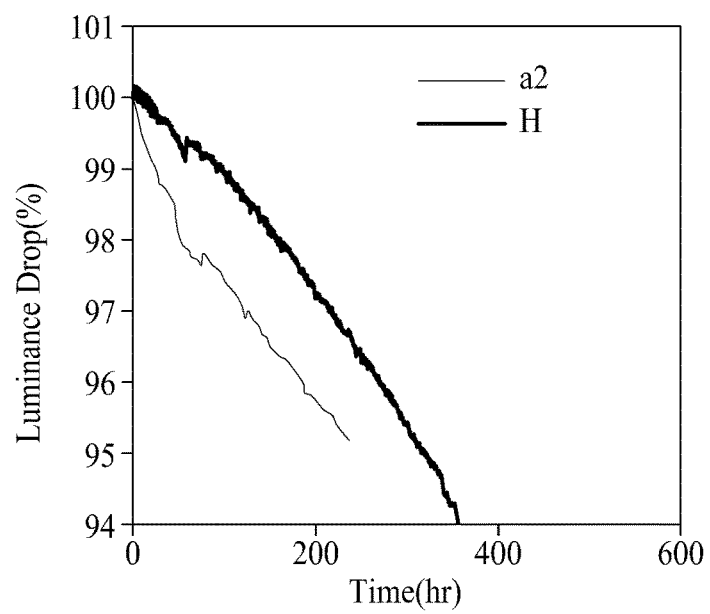
FIG. 16 is a diagram showing lifetimes in a comparative example 2 (a2) and an experiment example 8 (H) of the present disclosure.

FIG. 16 is a diagram showing lifetimes in the comparative example 2 and the experiment example 8 of the present disclosure.

In FIG. 16, the abscissa axis indicates time (hr), and the ordinate axis indicates a luminance drop rate (%). Also, the comparative example 2 is referred to as a2, and the experiment example 8 is referred to as H.

As shown in FIG. 16, when initial emission luminance is 100%, it can be seen that in time (i.e., a 95% lifetime (T95) of the organic light emitting device) taken until luminance is reduced by 95%, the comparative example 2 is about 320 hours, and the experiment example 8 is about 380 hours. Therefore, it can be seen that the lifetime of the experiment example 8 corresponding to the seventh embodiment of the present disclosure increases by about 1.2 times lifetime of the comparative example 2. That is, it can be seen that efficiency is further enhanced in the seventh embodiment of the present disclosure, where the first ETL 716 is configured so that a difference between an energy bandgap of the first ETL 716 and an energy bandgap of a host included in the N-type CGL 741 is 0.50 eV or more, than the comparative example 2.

Moreover, FIG. 16 shows blue lifetime, and a total lifetime of the organic light emitting display device is enhanced further in the experiment example 8 than the comparative example 2.

Figure 17:
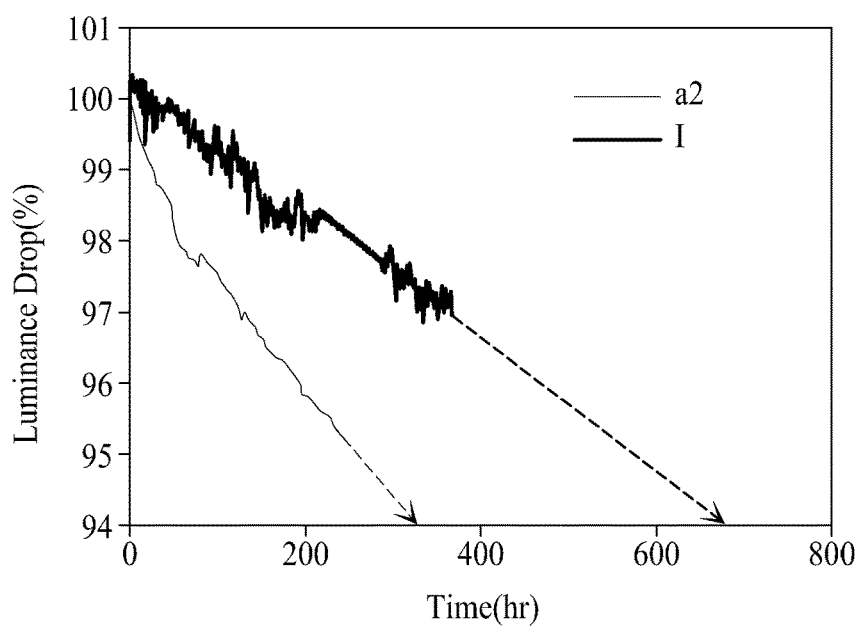
FIG. 17 is a diagram showing lifetimes in a comparative example 2 (a2) and an experiment example 9 (I) of the present disclosure.

FIG. 17 is a diagram showing lifetimes in the comparative example 2 and the experiment example 9 of the present disclosure.

In FIG. 17, the abscissa axis indicates time (hr), and the ordinate axis indicates a luminance drop rate (%). Also, the comparative example 2 is referred to as a2, and the experiment example 9 is referred to as I.

As shown in FIG. 17, when initial emission luminance is 100%, it can be seen that in time (i.e., a 95% lifetime (T95) of the organic light emitting device) taken until luminance is reduced by 95%, the comparative example 2 is about 320 hours, and the experiment example 9 corresponding to the eighth embodiment of the present disclosure is about 700 hours. Therefore, it can be seen that the lifetime of the eighth embodiment of the present disclosure increases by about 2.2 times lifetime of the comparative example 2. That is, it can be seen that efficiency is further enhanced in the eighth embodiment of the present disclosure, where the first ETL 816 is configured so that a difference between an energy bandgap of the first ETL 816 and an energy bandgap of a host included in the N-type CGL 841 is 0.50 eV or more and the ECL is provided, than the comparative example 2.

Moreover, FIG. 17 shows blue lifetime, and a total lifetime of the organic light emitting display device is enhanced further in the experiment example 9 than the comparative example 2.

Through such a result, it can be seen that lifetime is enhanced further in the seventh embodiment of the present disclosure, where the first ETL 716 is configured so that a difference between an energy bandgap of the first ETL 716 and an energy bandgap of a host included in the N-type CGL 741 is 0.50 eV or more, the second ETL 726 is formed of at least two materials having different absolute values of LUMO energy levels, and the ECL 723 is provided, than the comparative example 2 where a difference between an energy bandgap of the first ETL 716 and an energy bandgap of a host included in the N-type CGL 741 is 0.40 eV. Also, in comparison with the second embodiment of the present disclosure, it can be seen that in the seventh embodiment of the present invention, as time elapses, lifetime is not changed to a bell shape but becomes linear, namely, lifetime is improved.

Moreover, it can be seen that lifetime is enhanced further in the eighth embodiment of the present disclosure, where the first ETL 816 is configured so that a difference between an energy bandgap of the first ETL 816 and an energy bandgap of a host included in the N-type CGL 841 is 0.50 eV or more, the first ECL 813 is provided, and the second ETL 826 is formed of at least two materials having different absolute values of LUMO energy levels, and the second ECL 823 is provided, than the comparative example 2. That is, an organic light emitting display device where lifetime is not reduced despite the elapse of time is provided.

If the organic light emitting device according to the second to eighth embodiments of the present disclosure is applied to an organic light emitting display device, a display device including three pixels (for example, a red pixel, a green pixel, and a blue pixel) which each include a mono-color device may be implemented. Therefore, a display device which combines three primary colors of RGB to express various colors may be implemented. Also, the organic light emitting device according to the second to eighth embodiments of the present disclosure may be applied to a bottom emission display device, a top emission display device, a dual emission display device, a lighting device for vehicles, and/or the like. The lighting device for vehicles may be at least one among headlight, a high beam, taillight, a brake light, a back-up light, a fog lamp, a turn signal light, and an auxiliary lamp, but is not limited thereto. Alternatively, the organic light emitting display device including the organic light emitting device according to the second to eighth embodiments of the present disclosure may be applied to all indicator lamps which are used to secure a field of view of a driver and transmit or receive a signal of a vehicle. Also, the organic light emitting display device including the organic light emitting device according to the second to eighth embodiments of the present disclosure may be applied to mobile equipment, monitors, televisions (TVs), and/or the like.

As described above, an ETL according to the embodiments of the present disclosure may be configured so that an absolute value of a LUMO energy level of a first material is greater than an absolute value of a LUMO energy level of a second material and a content of the second material is higher than that of the first material, and thus, an emission area may be located in an EML, thereby providing an organic light emitting display device with enhanced lifetime.

Moreover, an ETL according to the embodiments of the present disclosure may be configured so that an absolute value of a LUMO energy level of a first material is greater than an absolute value of a LUMO energy level of a second material and a content of the second material is higher than that of the first material, and an ECL may be formed. Accordingly, an emission area of an EML is spread with the elapse of time, thereby providing an organic light emitting display device in which lifetime is steadily reduced with the elapse of time.

Moreover, according to the embodiments of the present disclosure, since an energy bandgap of an ETL is adjusted higher than an energy bandgap of a host included in a CGL, an emission area is located in an EML, thereby providing an organic light emitting display device with enhanced lifetime.

Moreover, according to the embodiments of the present disclosure, since an energy bandgap of an ETL is adjusted higher than an energy bandgap of a host included in a CGL and an ECL is provided, an emission area of an EML is spread with the elapse of time, thereby providing an organic light emitting display device in which lifetime is steadily reduced with the elapse of time.

Moreover, according to the embodiments of the present disclosure, since one of two ETLs is configured so that an absolute value of a LUMO energy level of a first material of an ETL is larger than an absolute value of a LUMO energy level of a second material and a content of the second material is higher than that of the first material, an ECL is provided, and the other of the two ETLs is configured so that an energy bandgap of an ETL is adjusted higher than an energy bandgap of a host included in a CGL, an emission area is located in an EML, thereby providing an organic light emitting display device with enhanced lifetime.

Moreover, according to the embodiments of the present disclosure, since one of two ETLs is configured so that an absolute value of a LUMO energy level of a first material of an ETL is larger than an absolute value of a LUMO energy level of a second material and a content of the second material is higher than that of the first material, the other of the two ETLs is configured so that an energy bandgap of an ETL is adjusted higher than an energy bandgap of a host included in a CGL, and an ECL is provided, an emission area of an EML is enlarged with the elapse of time, thereby providing an organic light emitting display device in which lifetime is stably reduced with the elapse of time.

An organic light emitting display device according to an embodiment of the present disclosure may include an anode on a substrate, a first emission part that is disposed on the anode and includes a first emission layer and a first electron transfer layer, a second emission part that is disposed on the first emission part and includes a second emission layer and a second electron transfer layer, and a cathode on the second emission part. At least one among the first electron transfer layer and the second electron transfer layer may include a first material and a second material, and an absolute value of a LUMO energy level of the first material may be larger than an absolute value of a LUMO energy level of the second material.

A content of the second material may be adjusted higher than a content of the first material.

In the first electron transfer layer or the second electron transfer layer, a content of the second material may be more than 50 wt %.

The first material and the second material may be mixed through co-deposition.

The absolute value of the LUMO energy level of the first material may be within a range of 2.91 eV to 3.40 eV, and the absolute value of the LUMO energy level of the second material may be within a range of 2.60 eV to 2.90 eV.

The first electron transfer layer may include one among the first material and the second material, and the second electron transfer layer may include the first material and the second material.

The organic light emitting display device may further include a second hole transfer layer on the first electron transfer layer and a second emission control layer between the second hole transfer layer and the second emission layer.

An absolute value of a HOMO energy level of the second emission control layer may be 0.10 eV to 0.50 eV larger than an absolute value of a HOMO energy level of the second hole transfer layer.

A hole mobility of the second emission control layer may be $1.0\times10^{-1}$ to $1.0\times10^{-2}$ times lower than a hole mobility of the second hole transfer layer.

The first electron transfer layer and the second electron transfer layer may each include the first material and the second material.

The organic light emitting display device may further include a first hole transfer layer on the anode and a first emission control layer between the first hole transfer layer and the first emission layer.

An absolute value of a HOMO energy level of the first emission control layer may be 0.10 eV to 0.50 eV larger than an absolute value of a HOMO energy level of the first hole transfer layer.

A hole mobility of the first emission control layer may be $1.0\times10^{-1}$ to $1.0\times10^{-2}$ times lower than a hole mobility of the first hole transfer layer.

The organic light emitting display device may further include a second hole transfer layer on the first electron transfer layer and a second emission control layer between the second hole transfer layer and the second emission layer.

An absolute value of a HOMO energy level of the second emission control layer may be 0.10 eV to 0.50 eV larger than an absolute value of a HOMO energy level of the second hole transfer layer.

A hole mobility of the second emission control layer may be $1.0\times10^{-1}$ to $1.0\times10^{-2}$ times lower than a hole mobility of the second hole transfer layer.

The second electron transfer layer may include the first material and the second material.

The organic light emitting display device may further include an N-type charge generation layer between the first emission part and the second emission part, and the first electron transfer layer may include a material having an energy bandgap which is 0.50 eV to 1.00 eV higher than an energy bandgap of a host included in the N-type charge generation layer.

An absolute value of a LUMO energy level of the first electron transfer layer may be within a range of 2.00 eV to 2.50 eV, and an absolute value of a LUMO energy level of the N-type charge generation layer may be within a range of 2.90 eV to 3.20 eV.

The organic light emitting display device may further include an emission control layer under at least one of the first emission layer and the second emission layer.

The first emission layer and the second emission layer may emit light having the same color.

An organic light emitting display device according to an embodiment of the present disclosure may include an anode on a substrate, a first emission part that is disposed on the anode and includes a first hole transfer layer, a first emission layer, and a first electron transfer layer, a second emission part that is disposed on the first emission part and includes a second hole transfer layer, a second emission layer, and a second electron transfer layer, and a cathode on the second emission part. At least one among the first emission part and the second emission part may include an emission control layer having an absolute value of a HOMO energy level which is larger than an absolute value of a HOMO energy level of the first hole transfer layer or the second hole transfer layer.

An absolute value of a HOMO energy level of the emission control layer may be 0.10 eV to 0.50 eV larger than an absolute value of a HOMO energy level of the first hole transfer layer or the second hole transfer layer.

A hole mobility of the emission control layer may be $1.0\times10^{-1}$ to $1.0\times10^{-2}$ times lower than a hole mobility of the first hole transfer layer or the second hole transfer layer.

The second electron transfer layer may include at least two materials, and a material having a small absolute value of a LUMO energy level among the at least two materials may be higher in content than another material having a large absolute value of the LUMO energy level among the at least two materials.

The emission control layer may be provided in the second emission part and between the second hole transfer layer and the second emission layer.

The first electron transfer layer may include one among the at least two materials.

The first electron transfer layer and the second electron transfer layer may each include at least two materials, and a material having a small absolute value of a LUMO energy level among the at least two materials may be higher in amount than another material having a large absolute value of the LUMO energy level among the at least two materials.

The emission control layer may be provided in the first emission part and the second emission part, between the first hole transfer layer and the first emission layer, and between the second hole transfer layer and the second emission layer.

The organic light emitting display device may further include an N-type charge generation layer between the first emission part and the second emission part, and the first electron transfer layer may include a material having an energy bandgap which is 0.50 eV to 1.00 eV higher than an energy bandgap of a host included in the N-type charge generation layer.

The emission control layer may be provided in the first emission part and between the first hole transfer layer and the first emission layer.

The second electron transfer layer may include at least two materials, and a material having a small absolute value of a LUMO energy level among the at least two materials may be higher in content than another material having a large absolute value of the LUMO energy level among the at least two materials.

The emission control layer may be provided in the second emission part and between the second hole transfer layer and the second emission layer.

The first electron transfer layer may include one among anthracene derivatives, triazine derivatives, and carbozole derivatives.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display device, comprising:
   a plurality of pixels on a substrate, the plurality of pixels having a red subpixel, a green subpixel, and a blue subpixel;
   an anode on the substrate;
   a first hole transfer layer on the anode;
   a first emission layer on the first hole transfer layer in the red subpixel, the green subpixel, and the blue subpixel;
   a first electron transfer layer on the first emission layer;
   an N-type charge generation layer on the first electron transfer layer;
   a second hole transfer layer on the N-type charge generation layer;
   a second emission layer on the second hole transfer layer in the red subpixel, the green subpixel, and the blue subpixel;
   a second electron transfer layer on the second emission layer; and
   a cathode on the second electron transfer layer,
   wherein a difference between a lowest unoccupied molecular orbital (LUMO) energy level of the first electron transfer layer and a LUMO energy level of the N-type charge generation layer is 0.50 eV to 1.00 eV.

2. The organic light emitting display device of claim 1, wherein an absolute value of the LUMO energy level of the first electron transfer layer is within a range of 2.00 eV to 2.50 eV, and an absolute value of the LUMO energy level of the N-type charge generation layer is within a range of 2.90 eV to 3.20 eV.

3. The organic light emitting display device of claim 1, wherein the second electron transfer layer includes a first material and a second material and an absolute value of a LUMO energy level of the first material is different from an absolute value of a LUMO energy level of the second material.

4. The organic light emitting display device of claim 3, wherein the absolute value of a LUMO energy level of the first material is within a range of 2.91 eV to 3.40 eV and the absolute value of a LUMO energy level of the second material is within a range of 2.60 eV to 2.90 eV.

5. The organic light emitting display device of claim 3, wherein an amount of the second material is higher than an amount of the first material.

6. The organic light emitting display device of claim 3, wherein a content of the second material is more than 50 wt % of a content of the first material.

7. The organic light emitting display device of claim 3, wherein the first material comprises one among anthracene derivatives, triazine derivatives, and carbozole derivatives.

8. The organic light emitting display device of claim 1, wherein the first hole transfer layer includes a P-type hole transfer layer doped with a P-type dopant.

9. The organic light emitting display device of claim 1, wherein the first emission layer and the second emission layer include one or more of a red emitting layer, a green emitting layer, and a blue emitting layer.

10. The organic light emitting display device of claim 1, wherein the first emission layer and the second emission layer emit light having a same color.

11. The organic light emitting display device of claim 1, further comprising a P-type charge generation layer between the N-type charge generation layer and the second hole transfer layer.

12. The organic light emitting display device of claim 1, further comprising an emission control layer between the second hole transfer layer and the second emission layer and an absolute value of a highest occupied molecular orbital (HOMO) energy level of the emission control layer is greater than an absolute value of a HOMO energy level of the second hole transfer layer.

13. The organic light emitting display device of claim 12, wherein a hole mobility of the emission control layer is lower than a hole mobility of the second hole transfer layer.

14. The organic light emitting display device of claim 1, further comprising an emission control layer between the first hole transfer layer and the first emission layer, and an absolute value of a highest occupied molecular orbital (HOMO) energy level of the emission control layer is greater than an absolute value of a HOMO energy level of the first hole transfer layer.

15. The organic light emitting display device of claim 14, wherein a hole mobility of the emission control layer is lower than a hole mobility of the first hole transfer layer.

16. The organic light emitting display device of claim 1, further comprising a first emission control layer between the first hole transfer layer and the first emission layer, and a second emission control layer between the second hole transfer layer and the second emission layer.

17. The organic light emitting display device of claim 16, wherein an absolute value of a highest occupied molecular orbital (HOMO) energy level of the first emission control layer is greater than an absolute value of a HOMO energy level of the first hole transfer layer and an absolute value of a highest occupied molecular orbital (HOMO) energy level of the second emission control layer is greater than an absolute value of a HOMO energy level of the second hole transfer layer.

18. The organic light emitting display device of claim 16, wherein a hole mobility of the first emission control layer is lower than a hole mobility of the first hole transfer layer and a hole mobility of the second emission control layer is lower than a hole mobility of the second hole transfer layer.

19. An organic light emitting display device, comprising:
   a plurality of pixels on a substrate, the plurality of pixels having a red subpixel, a green subpixel, and a blue subpixel;
   an anode on the substrate;
   a first hole transfer layer on the anode;
   a first emission layer on the first hole transfer layer in the red subpixel, the green subpixel, and the blue subpixel;
   a first electron transfer layer on the first emission layer;
   an N-type charge generation layer on the first electron transfer layer;
   a second hole transfer layer on the N-type charge generation layer;

a second emission layer on the second hole transfer layer in the red subpixel, the green subpixel, and the blue subpixel;

a second electron transfer layer on the second emission layer, the second electron transfer layer having a first material and a second material, and an absolute value of a lowest unoccupied molecular orbital (LUMO) energy level of the first material being larger than an absolute value of a LUMO energy level of the second material; and a cathode on the second electron transfer layer, wherein a difference between a lowest unoccupied molecular orbital (LUMO) energy level of the first electron transfer layer and a LUMO energy level of the N-type charge generation layer is 0.50 eV to 1.00 eV.

20. The organic light emitting display device of claim 19, wherein the first material has an absolute value of the LUMO energy level is within a first range of 2.91 eV to 3.40 eV and the second material has an absolute value of the LUMO energy level is within a second range of 2.60 eV to 2.90 eV.

21. The organic light emitting display device of claim 19, wherein an amount of the second material is higher than an amount of the first material.

22. The organic light emitting display device of claim 19, wherein in the second electron transfer layer, a content of the second material is more than 50 wt %.

23. The organic light emitting display device of claim 19, further comprising an emission control layer between the second hole transfer layer and the second emission layer, and an absolute value of a highest occupied molecular orbital (HOMO) energy level of the emission control layer is greater than an absolute value of a HOMO energy level of the second hole transfer layer.

24. The organic light emitting display device of claim 23, wherein a hole mobility of the emission control layer is lower than a hole mobility of the second hole transfer layer.

25. The organic light emitting display device of claim 19, further comprising an emission control layer between the first hole transfer layer and the first emission layer, and an absolute value of a highest occupied molecular orbital (HOMO) energy level of the emission control layer is greater than an absolute value of a HOMO energy level of the first hole transfer layer.

26. The organic light emitting display device of claim 25, wherein a hole mobility of the emission control layer is lower than a hole mobility of the first hole transfer layer.

27. The organic light emitting display device of claim 19, further comprising a first emission control layer between the first hole transfer layer and the first emission layer, and a second emission control layer between the second hole transfer layer and the second emission layer.

28. The organic light emitting display device of claim 27, wherein an absolute value of a highest occupied molecular orbital (HOMO) energy level of the first emission control layer is greater than an absolute value of a HOMO energy level of the first hole transfer layer and an absolute value of a highest occupied molecular orbital (HOMO) energy level of the second emission control layer is greater than an absolute value of a HOMO energy level of the second hole transfer layer.

29. The organic light emitting display device of claim 28, wherein a hole mobility of the first emission control layer is lower than a hole mobility of the first hole transfer layer and a hole mobility of the second emission control layer is lower than a hole mobility of the second hole transfer layer.

30. The organic light emitting display device of claim 19, wherein the first emission layer and the second emission layer include one or more of a red emitting layer, a green emitting layer, and a blue emitting layer.

31. The organic light emitting display device of claim 19, wherein the first emission layer and the second emission layer emit light having a same color.

* * * * *